United States Patent
Chen et al.

(10) Patent No.: US 9,991,207 B2
(45) Date of Patent: Jun. 5, 2018

(54) TEST KEY STRCUTURES, INTEGRATED CIRCUIT PACKAGES AND METHODS OF FORMING THE SAME

(71) Applicant: Taiwan Semiconductor Manufacturing Co., Ltd., Hsinchu (TW)

(72) Inventors: Shao-Yun Chen, Tao-yuan (TW); Hsien-Wei Chen, Hsinchu (TW); Li-Hsien Huang, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 18 days.

(21) Appl. No.: 15/162,630

(22) Filed: May 24, 2016

(65) Prior Publication Data
US 2017/0278802 A1 Sep. 28, 2017

Related U.S. Application Data

(60) Provisional application No. 62/313,106, filed on Mar. 24, 2016.

(51) Int. Cl.
*H01L 23/544* (2006.01)
*H01L 23/528* (2006.01)
*H01L 21/66* (2006.01)
*H01L 23/48* (2006.01)
*H01L 25/18* (2006.01)
*H01L 21/56* (2006.01)
*H01L 21/78* (2006.01)
*H01L 23/00* (2006.01)
(Continued)

(52) U.S. Cl.
CPC ............ *H01L 23/544* (2013.01); *H01L 21/56* (2013.01); *H01L 21/6835* (2013.01); *H01L 21/768* (2013.01); *H01L 22/32* (2013.01); *H01L 23/481* (2013.01); *H01L 23/528* (2013.01); *H01L 24/10* (2013.01); *H01L 24/18* (2013.01); *H01L 25/0655* (2013.01); *H01L 25/18* (2013.01); *H01L 2221/68372* (2013.01); *H01L 2221/68381* (2013.01); *H01L 2223/5446* (2013.01); *H01L 2223/54426* (2013.01); *H01L 2223/54486* (2013.01)

(58) Field of Classification Search
CPC .............................. H01L 21/768; H01L 23/32
See application file for complete search history.

(56) References Cited

U.S. PATENT DOCUMENTS 5,874,778 A * 2/1999 Bhattacharyya .... H01L 23/5286
257/758
2014/0151893 A1* 6/2014 Boyanov ............. H01L 23/5329
257/774

(Continued)

*Primary Examiner* — Moazzam Hossain
*Assistant Examiner* — Farun Lu
(74) *Attorney, Agent, or Firm* — JCIPRNET

(57) ABSTRACT

Test key structures, integrated circuit packages and methods of forming the same are disclosed. One of the test key structures includes a first pattern over a polymer layer, and at least one second pattern covering the first pattern. Besides, the second pattern and the first pattern have substantially the same outer profile, one of the first pattern and the second pattern includes a dielectric material and the other of the first pattern and the second pattern includes a metal material.

19 Claims, 24 Drawing Sheets

(51) Int. Cl.
*H01L 21/683* (2006.01)
*H01L 25/065* (2006.01)
*H01L 21/768* (2006.01)

(56) References Cited

U.S. PATENT DOCUMENTS

2016/0047857 A1* 2/2016 Lee .................... G01R 31/2891
 324/750.22
2016/0247766 A1* 8/2016 Conklin ................ H01L 23/544

* cited by examiner

US 9,991,207 B2

1

TEST KEY STRCUTURES, INTEGRATED CIRCUIT PACKAGES AND METHODS OF FORMING THE SAME

CROSS-REFERENCE TO RELATED APPLICATION

This application claims the priority benefits of U.S. provisional application Ser. No. 62/313,106, filed on Mar. 24, 2016. The entirety of the above-mentioned patent application is hereby incorporated by reference herein and made a part of this specification.

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

2

FIG. 11 to FIG. 14 illustrate top perspective views and cross-sectional views of different alignment marks in accordance with some embodiments.

Figure 15:
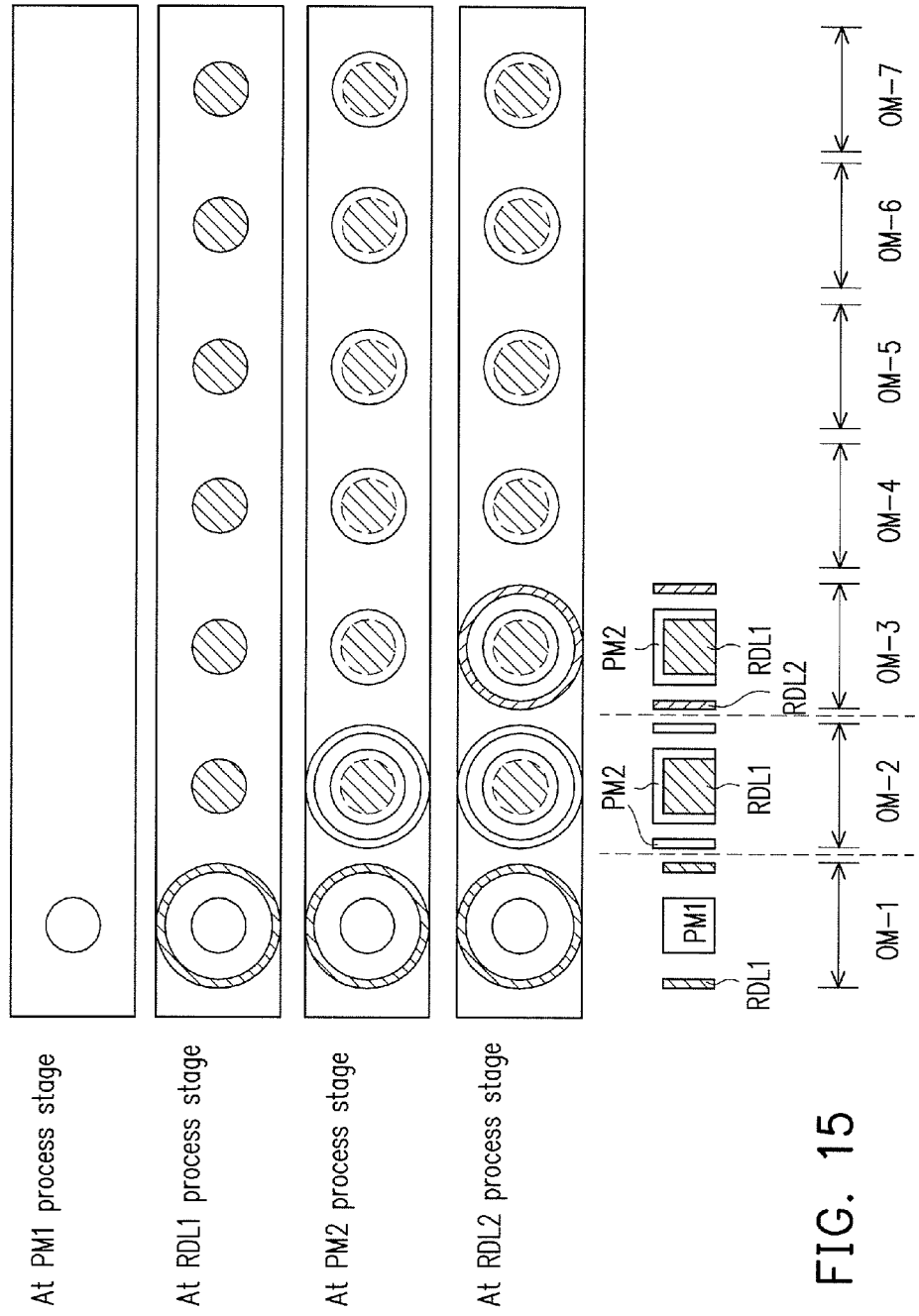
Figure 16:
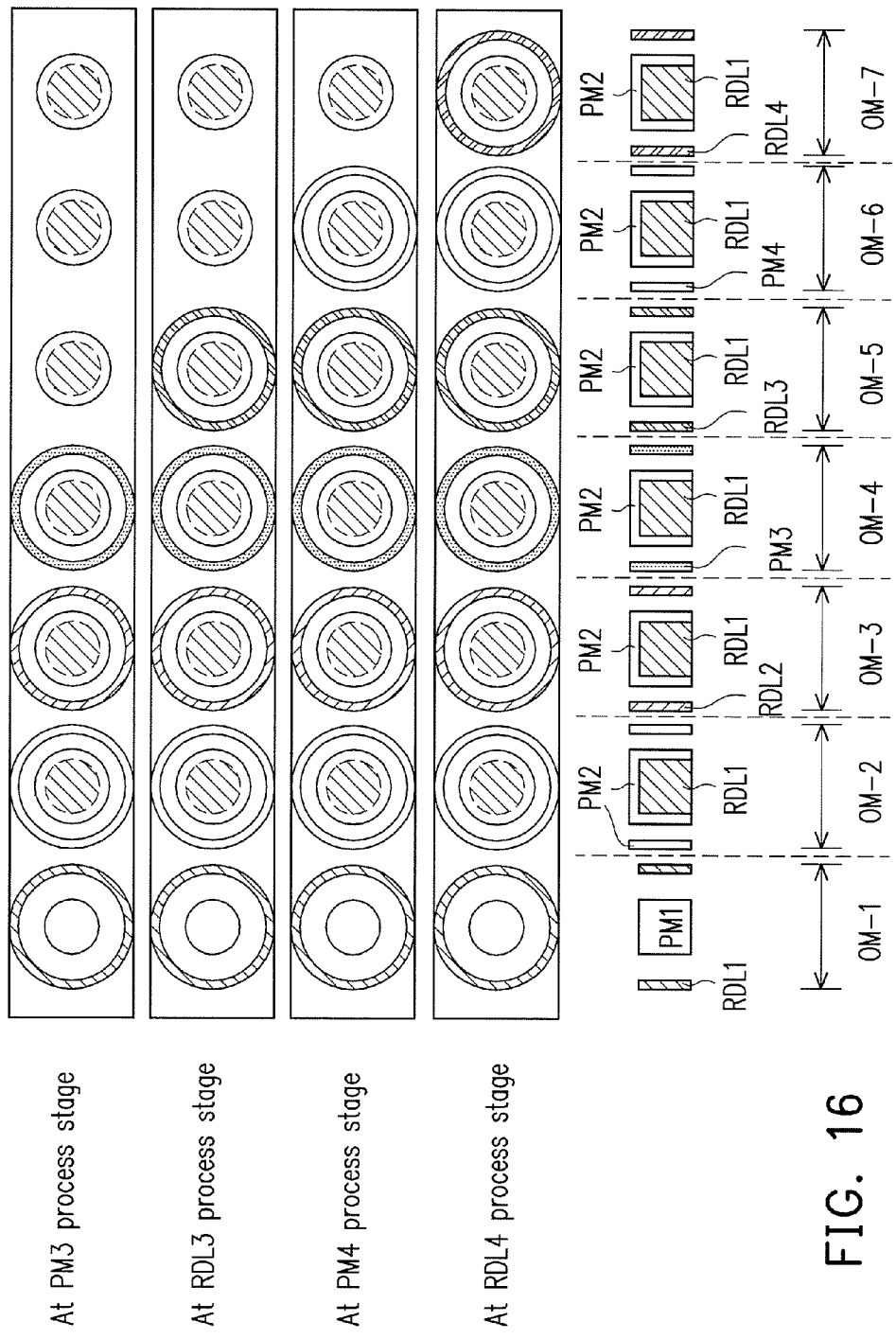

FIG. 15 to FIG. 16 illustrate top perspective views at different process stages and final cross-sectional views of overlay marks in accordance with some embodiments.

DETAILED DESCRIPTION

The following disclosure provides many different embodiments, or examples, for implementing different features of the provided subject matter. Specific examples of components and arrangements are described below for the purposes of conveying the present disclosure in a simplified manner. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the same reference numerals and/or letters may be used to refer to the same or similar parts in the various examples the present disclosure. The repeated use of the reference numerals is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein to facilitate the description of one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
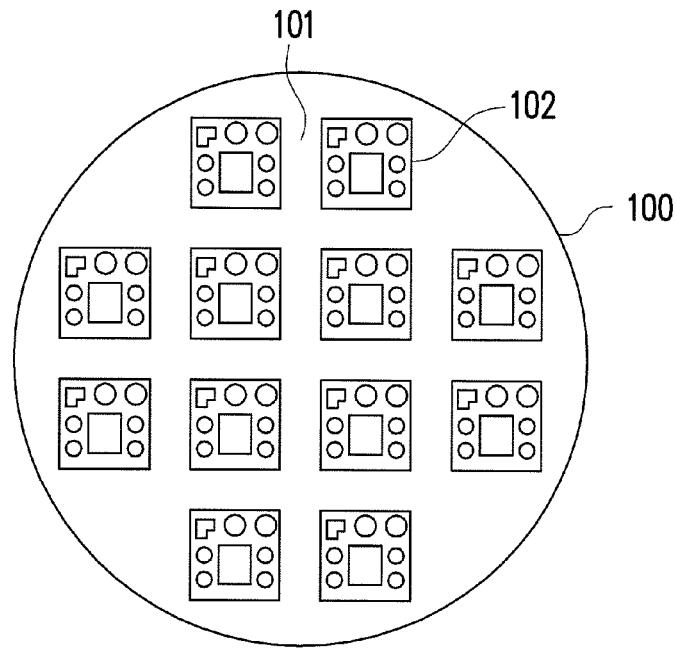
FIG. 1A illustrates a simplified top view of a carrier with multiple package regions in accordance with some embodiments.
Figure 1B:
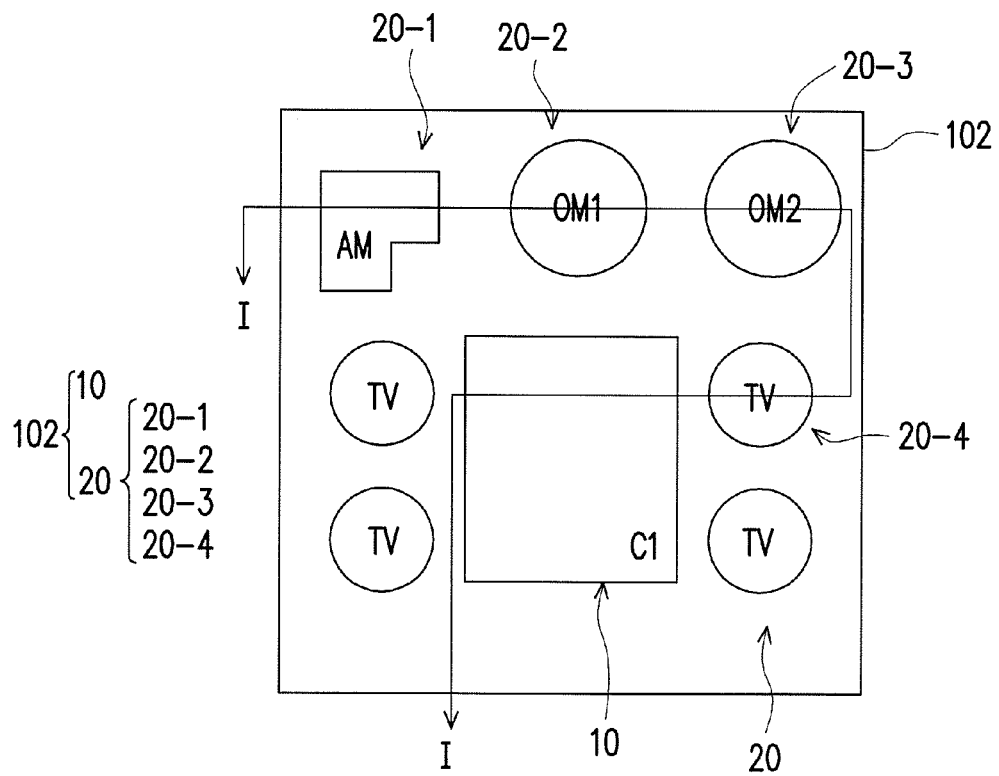
FIG. 1B illustrates an enlarged view of a package region in FIG. 1A.

FIG. 1A illustrates a simplified top view of a carrier with multiple package regions in accordance with some embodiments, in which only few elements are illustrated for simplicity and description convenience. FIG. 1B illustrates an enlarged view of a package region in FIG. 1A.

In some embodiments, a carrier 100 or wafer is provided with a plurality of package regions 102. In some embodiment, the carrier 100 includes a non-semiconductor material, such as a glass carrier, a ceramic carrier, or the like. The package regions 102 are separated or defined by scribe lines 101. The scribe lines 101 are dice/cut therethrough in a later fabrication process to provide individual integrated circuit packages.

Each package region 102 has at least one chip and at least one test key structure. The chip includes an integrated circuit chip, such as a logic chip, a memory chip or the like. The test key structure includes an alignment mark, an overlay mark or a stacked structure for testing a chip.

In some embodiments, each package region 102 has a chip area 10 and a periphery area 20 aside or around the chip area 10. In some embodiments, each package region 102 has at least one chip C1 located in the chip area 10 and at least one alignment mark AM, at least two overlay marks OM1 and OM2 and a plurality of through vias TV located in the periphery area 20. In some embodiments, the chip area 10 is provided for the chip C1, and the periphery area 20 is divided to a first periphery area 20-1 for the alignment mark AM, a second periphery area 20-2 for the overlay mark OM1, a third periphery area 20-3 for the overlay mark OM2 and a fourth periphery area 20-4 for the through vias TV.

Figure 2A:
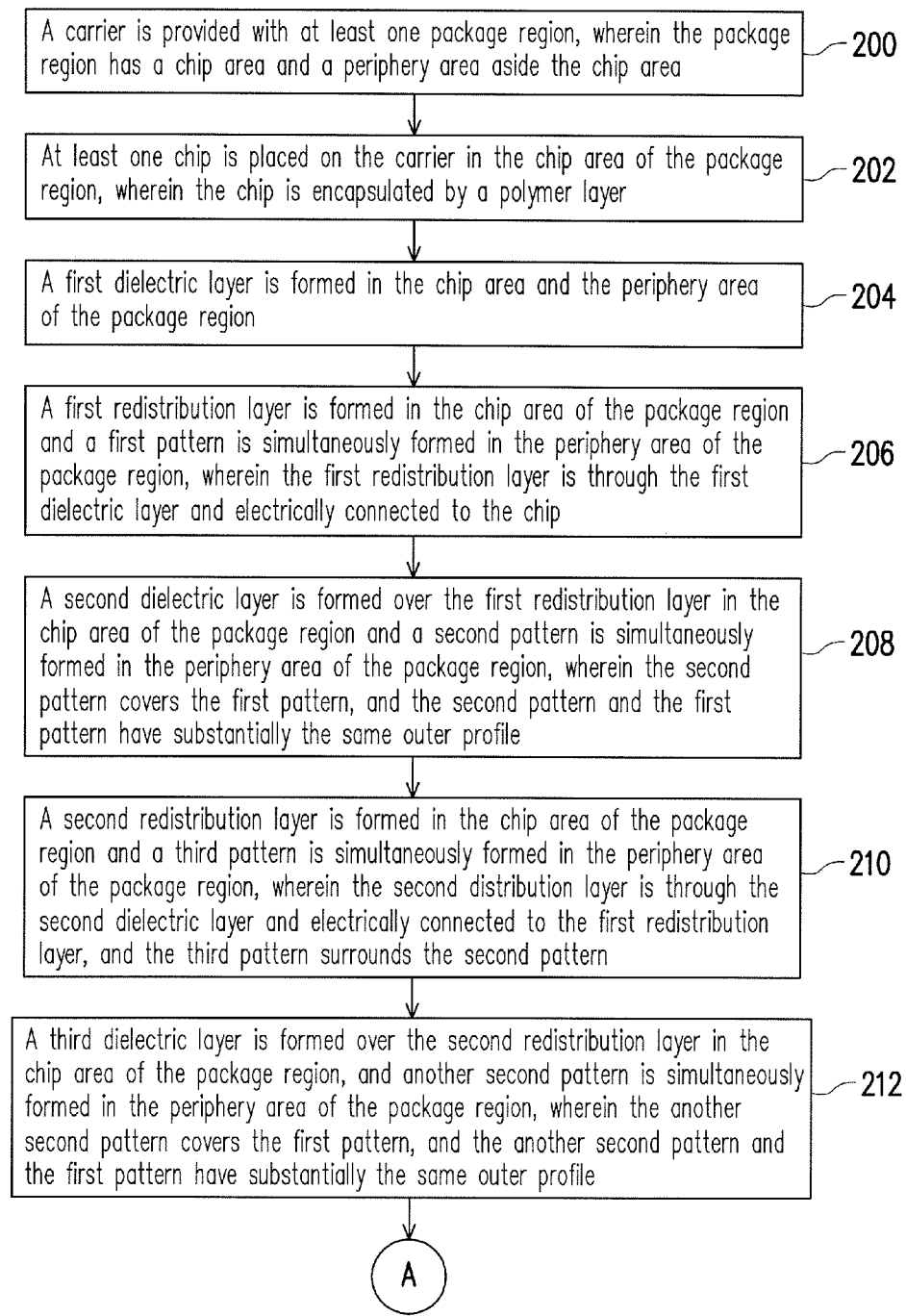
FIG. 2A to FIG. 2B illustrate a flow chart of a method of forming an integrated circuit package in accordance with some embodiments.
Figure 2B:
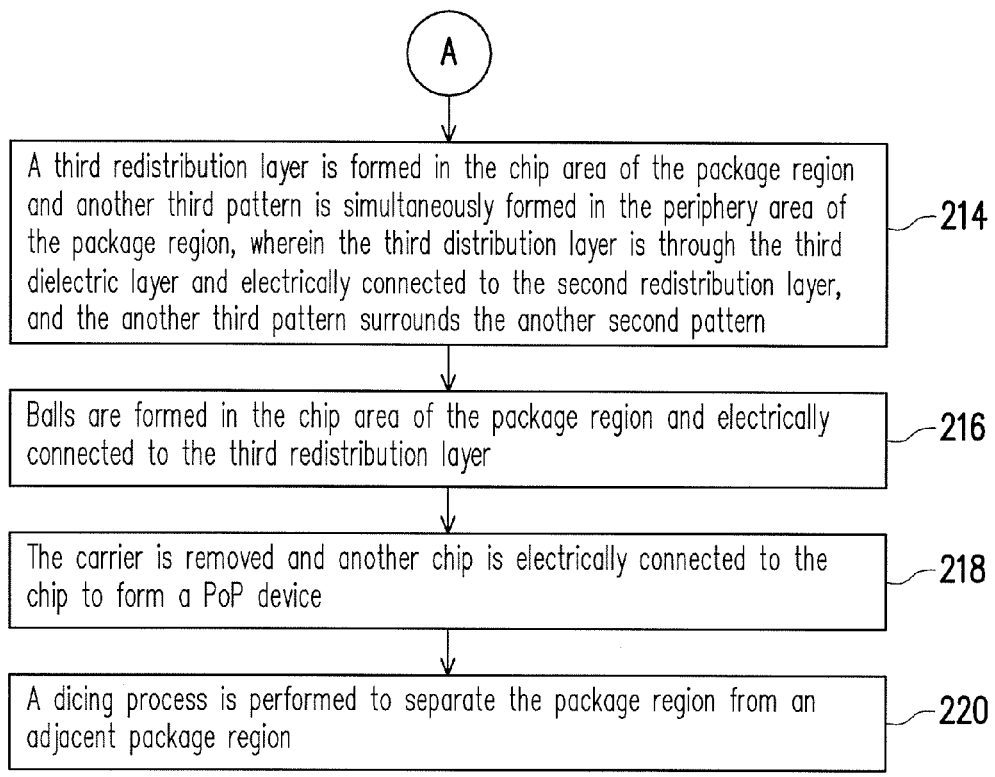

FIG. 2A to FIG. 2B illustrate a flow chart of a method of forming an integrated circuit package in accordance with some embodiments. FIG. 3A to FIG. 3G illustrate cross-sectional views of a method of forming an integrated circuit package taken along the line I-I of FIG. 1B in accordance with some embodiments.

Figure 3A:
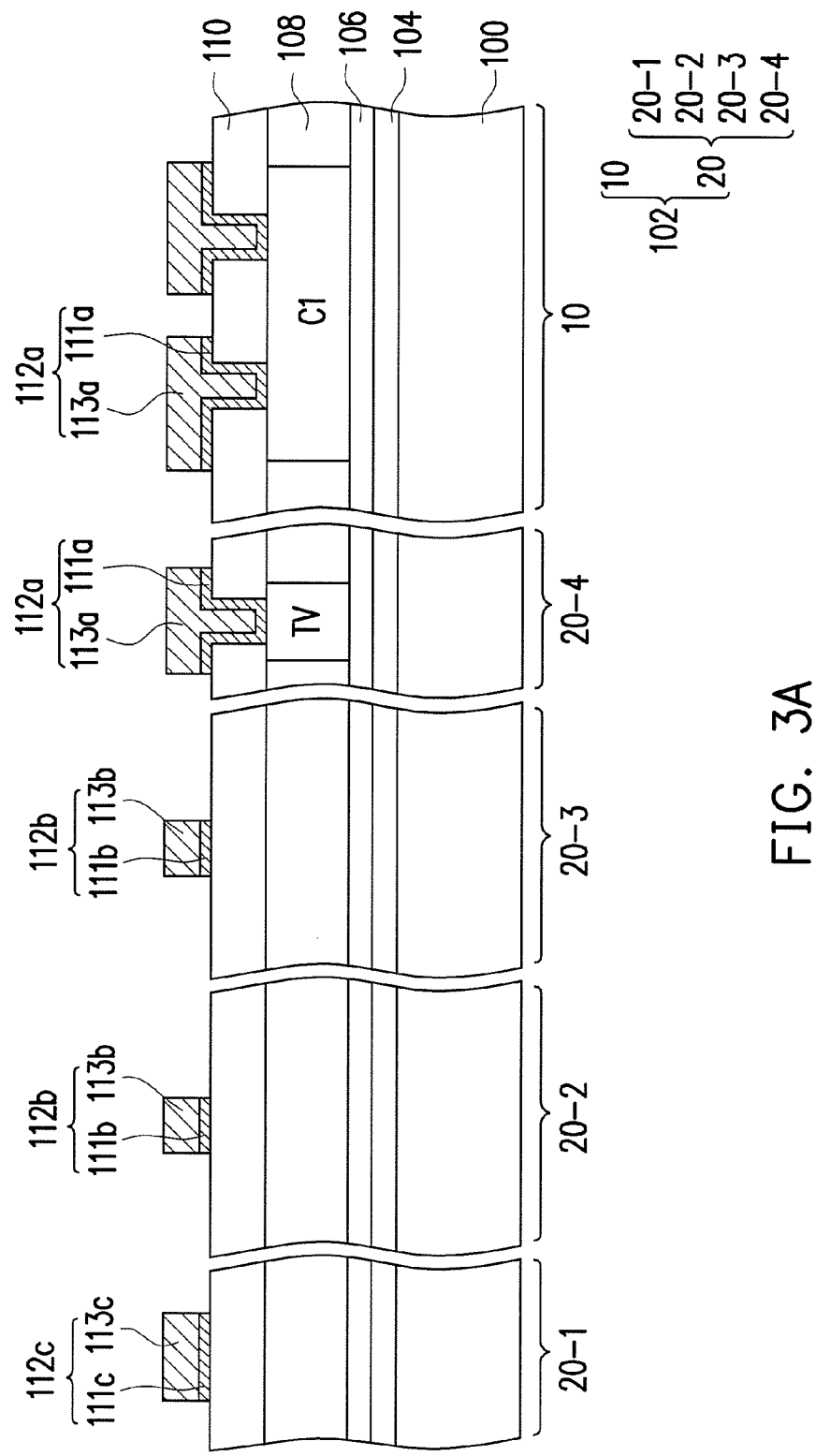
FIG. 3A to FIG. 3G illustrate cross-sectional views of a method of forming an integrated circuit package taken along the line I-I of FIG. 1B in accordance with some embodiments.

Referring to FIG. 2A and FIG. 3A, at step 200, a carrier 100 is provided with at least one package region 102, wherein the package region 102 has a chip area 10 and a periphery area 20 aside the chip area 10.

In some embodiments, the carrier 100 is provided with a glue layer 104 and a dielectric layer 106 formed thereon. The carrier 100 may be a glass carrier. In some embodiments, the glue layer 104 is formed of an adhesive such as a Ultra-Violet (UV) glue, a Light-to-Heat Conversion (LTHC) glue, or the like, although other types of adhesives may be used. In some embodiments, the glue layer 104 is decomposable under the heat of light to thereby release the carrier 100 from the structure formed thereon. The dielectric layer 106 is formed over the glue layer 104. In some embodiments, the dielectric layer 106 is a polymer layer. The polymer layer includes polyimide, polybenzoxazole (PBO), benzocyclobutene (BCB), Ajinomoto Buildup Film (ABF), Solder Resist film (SR), or the like. The dielectric layer 106 is formed by a suitable fabrication technique such as spin-coating, lamination, deposition or the like.

Referring to FIG. 2A and FIG. 3A, at step 202, at least one chip C1 is placed on the carrier 100 in the chip area 10 of the package region 102, wherein the chip C1 is encapsulated by a polymer layer 108.

In some embodiments, the chip C1 is picked and placed on the dielectric layer 106 of the carrier 100. In some embodiments, before or after the step of placing the chip C1 on the carrier 100, through vias TV are formed on the dielectric layer 106 around the chip C1. In some embodiments, the through vias TV include copper posts, and are formed by photolithography, plating, and photoresist stripping processes. In some embodiments, the polymer layer 108 is formed on the dielectric layer 106 aside or surrounding the chip C1 and the through vias TV. In some embodiments, the polymer layer 108 includes a molding compound, a molding underfill, a resin or the like, such as epoxy, and is formed by a molding process followed by a grinding process until surfaces of the chip C1 and the through vias TV are exposed. In some embodiments, the polymer layer 108 completely covers the dielectric layer 106 in the first to third periphery areas 20-1 to 20-3 of the package region 102.

Referring to FIG. 2A and FIG. 3A, at step 204, a first dielectric layer 110 is formed in the chip area 10 and the periphery area 20 of the package region 102. The first dielectric layer 110 is marked as "PM1" in some drawings, because it is a first polymer layer in some embodiments.

In some embodiments, a first dielectric material layer (not shown) is formed across the chip area 10 and the periphery area 20. In some embodiments, the first dielectric material layer includes a polymer, such as PBO, polyimide, BCB, a combination thereof or the like, and is formed by a suitable fabrication technique such as spin-coating, lamination, deposition or the like. The first dielectric material layer is then patterned to form the first dielectric layer 110 having openings that expose a portion of the chip C1 (such as some or all connectors of the chip C1) and top surfaces of the through vias TV. In some embodiments, the first dielectric layer 110 completely covers the first to third periphery areas 20-1 to 20-3 while partially covers the forth periphery area 20-4 and the chip area 10.

Referring to FIG. 2A and FIG. 3A, at step 206, a first redistribution layer 112a is formed in the chip area 10 of the package region 102 and a first pattern 112b/112c is simultaneously formed in the periphery area 20 of the package region 102, wherein the first redistribution layer 112a is through the first dielectric layer 110 and electrically connected to the chip C1. The first pattern 112b/112c is marked as "RDL1" in some drawings, because it is formed from the process of defining the first redistribution layer 112a in some embodiments.

In some embodiments, a seed material layer (not shown) is formed across the chip area 10 and the periphery area 20, covers the top of the first dielectric layer 110 and the surfaces of the openings of the first dielectric layer 110. In some embodiments, the seed material layer includes a titanium/copper composite layer, and is formed by a sputtering process. Thereafter, a photoresist layer (not shown) with openings is formed on the seed material layer, and the openings of the photoresist layer expose the intended locations for the subsequently formed first redistribution layer 112a and the first pattern 112b/112c. Afterwards, a plating process is performed to form a metal material layer (e.g., a copper layer) on the seed material layer exposed by the openings of the photoresist layer. The photoresist layer and the underlying seed material layer are removed, so as to form the first redistribution layer 112a in the chip area 10 and the fourth periphery area 20-4, form the first pattern 112c in the first periphery area 20-1, and form the first pattern 112b in the second and third periphery areas 20-2 and 20-3. In some embodiments, the first redistribution layer 112a includes a seed layer 111a and a metal layer 113a, and is aimed through the first dielectric layer 110 and electrically connected to the chip C1 and the through vias TV. The first pattern 112b includes a seed layer 111b and a metal layer 113b, and the first pattern 112c includes a seed layer 111c and a metal layer 113c.

Figure 3B:
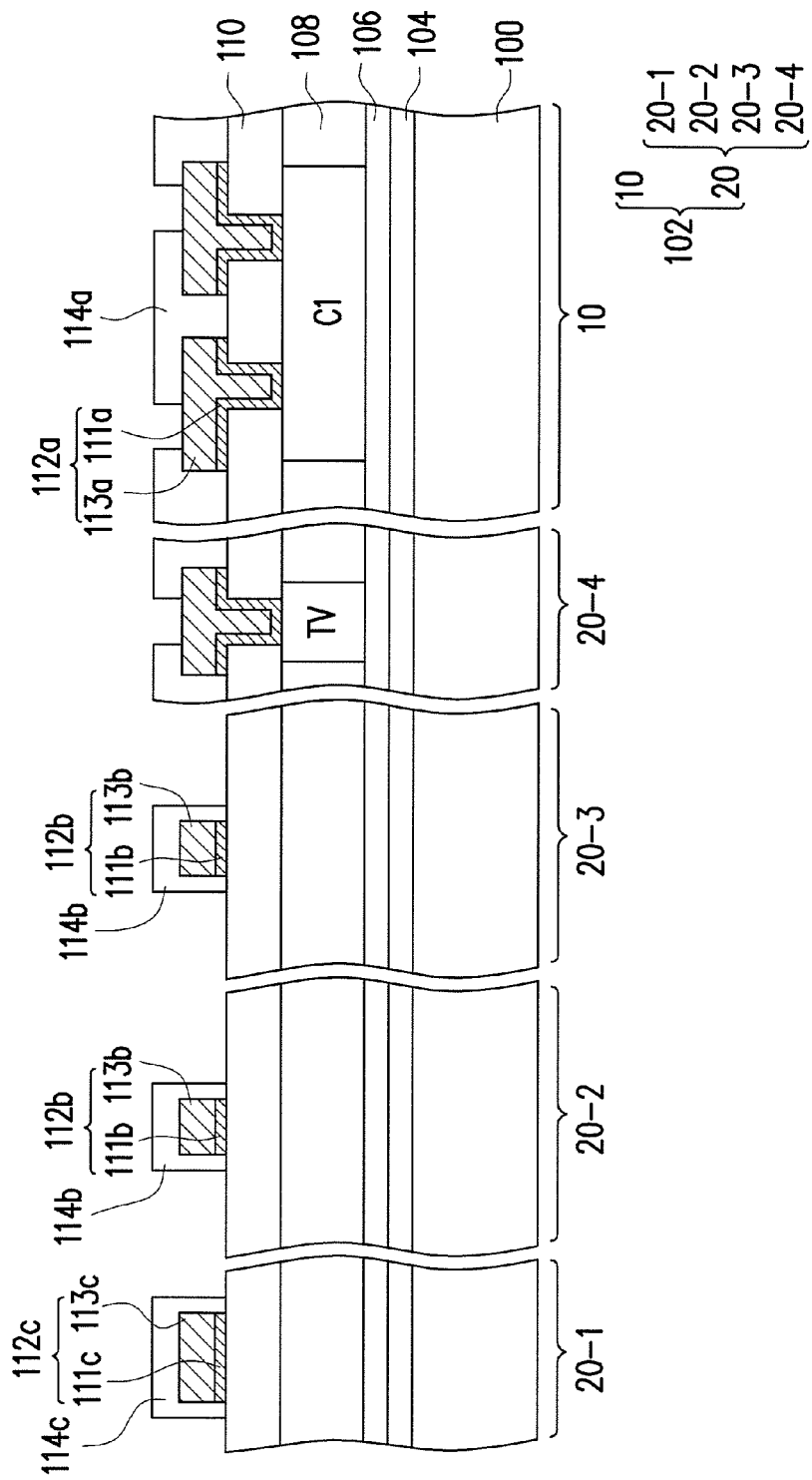

Referring to FIG. 2A and FIG. 3B, at step 208, a second dielectric layer 114a is formed over the first redistribution layer 112a in the chip area 10 of the package region 102, and a second pattern 114b/114c is simultaneously formed in the periphery area 20 of the package region 102, wherein the second pattern 114b/114c covers the first pattern 112b/112c and the second pattern 114b/114c and the first pattern 112b/112c have substantially the same outer profile. The second pattern 114b/114c is marked as "PM2" in some drawings, because it is a second polymer layer in some embodiments.

In some embodiments, a second dielectric material layer (not shown) is formed across the chip area 10 and the periphery area 20. In some embodiments, the second dielectric material layer includes a polymer, such as PBO, polyimide, BCB, a combination thereof or the like, and is formed by a suitable fabrication technique such as spin-coating, lamination, deposition or the like. The second dielectric material layer is then patterned to form the second dielectric layer 114a and the second pattern 114b/114c. In some embodiments, the second dielectric layer 114a has openings that expose a portion of the first redistribution layer 112a in the chip area 10 and the fourth periphery area 20-4. In some embodiments, in the first periphery area 20-1, the second pattern 114c conformally and completely covers the sidewall and top of the first pattern 112c, without extending along the surface of the first dielectric layer 110. That is, the second pattern 114c and the first pattern 112c have substantially the same outer profile. Similarly, in the second and third periphery areas 20-2 and 20-3, the second pattern 114b conformally and completely covers the sidewall and top of the first pattern 112b, without extending along the surface of the first dielectric layer 110. That is, the second pattern 114b and the first pattern 112b have substantially the same outer profile.

Figure 3C:
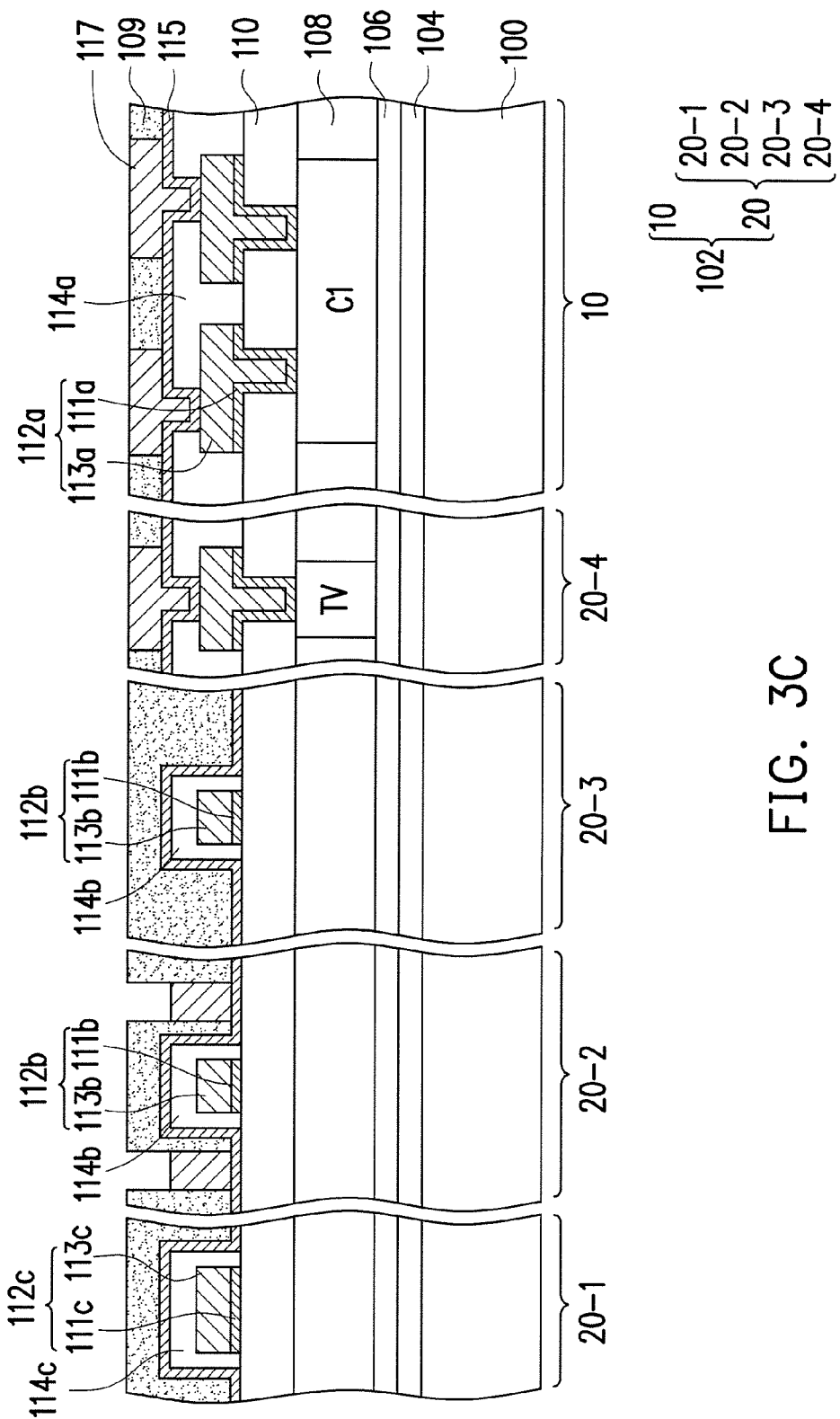
Figure 3D:
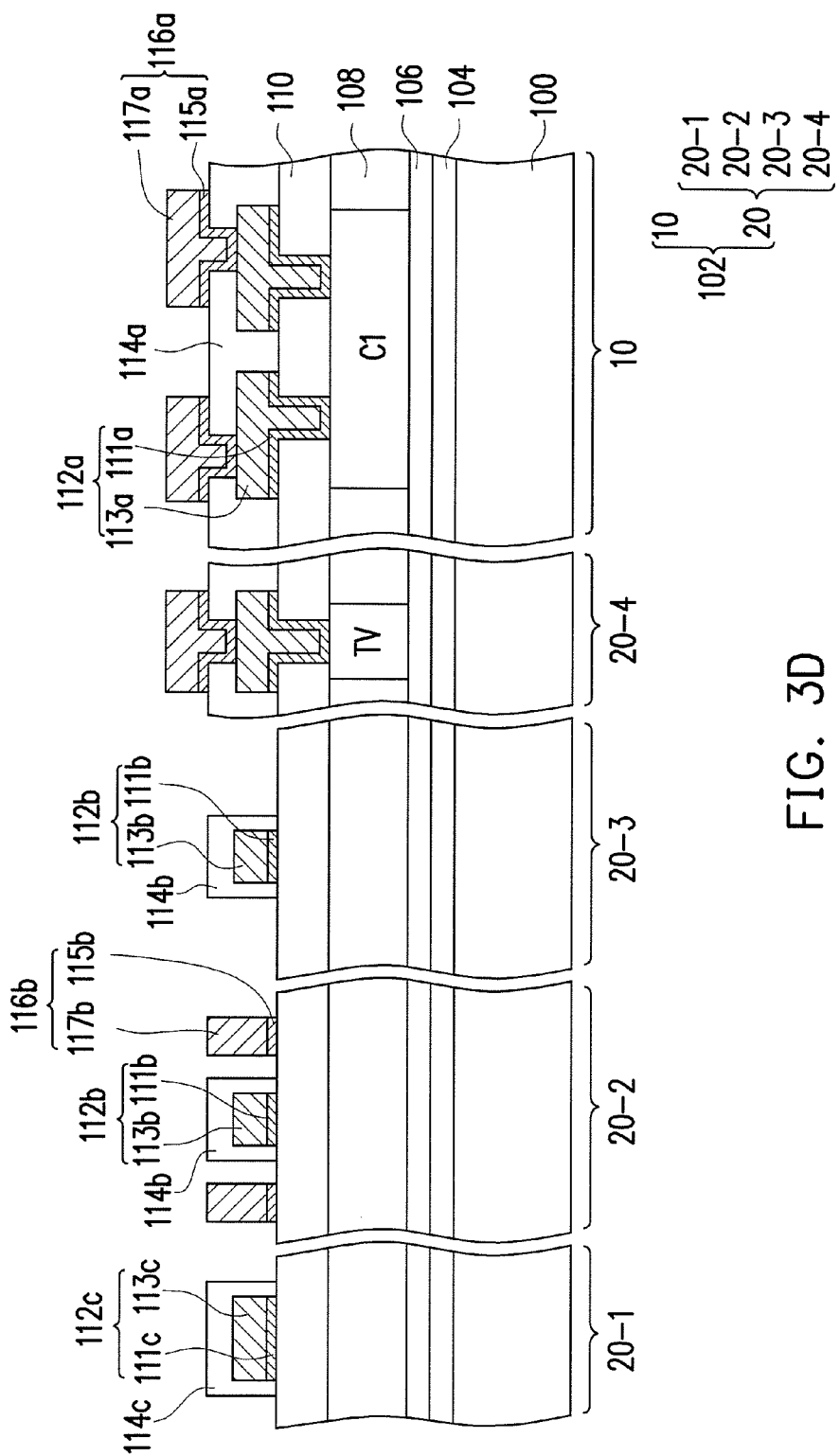

Referring to FIG. 2A, FIG. 3C and FIG. 3D, at step 210, a second redistribution layer 116a is formed in the chip area 10 of the package region 102 and a third pattern 116b is simultaneously formed in the periphery area 20 of the package region 10, wherein the second distribution layer 116a is through the second dielectric layer 114a and electrically connected to the first redistribution layer 112a, and the third pattern 116b surrounds the second pattern 114b. The third pattern 116b is marked as "RDL2" in some drawings, because it is formed from the process of defining the second redistribution layer 116a in some embodiments.

In some embodiments, a seed material layer 115 is formed across the chip area 10 and the periphery area 20. Specifically, the seed material layer 115 covers the top of the second dielectric layer 114a and the surfaces of the openings of the second dielectric layer 114a in the chip area 10 and the fourth periphery area 20-4, and covers the first dielectric layer 110 and the second pattern 114b/114c in the first to third periphery areas 20-1 to 20-3. In some embodiments, the seed material layer 115 includes a titanium/copper composite layer, and is formed by a sputtering process. Thereafter, a photoresist layer 109 with openings is formed on the seed material layer 115, and the openings of the photoresist layer 109 expose the intended locations for the subsequently formed second redistribution layer 116a and the third pattern 116b. Afterwards, a plating process is performed to form a metal material layer 117 (e.g., a copper layer) on the seed material layer 115 exposed by the openings of the photoresist layer 109. The photoresist layer 109 and the underlying seed material layer 115 are then removed, so as to form the second redistribution layer 116a in the chip area 10 and the fourth periphery area 20-4, and form the third pattern 116b in the second periphery area 20-2. In some embodiments, the second redistribution layer 116a includes a seed layer 115a and a metal layer 117a, and the third pattern 116b includes a seed layer 115b and a metal layer 117b. In some embodiments, the third pattern 116b surrounds the sidewall of the second pattern 114b and is separated from the second pattern 114b by a distance.

Figure 3E:
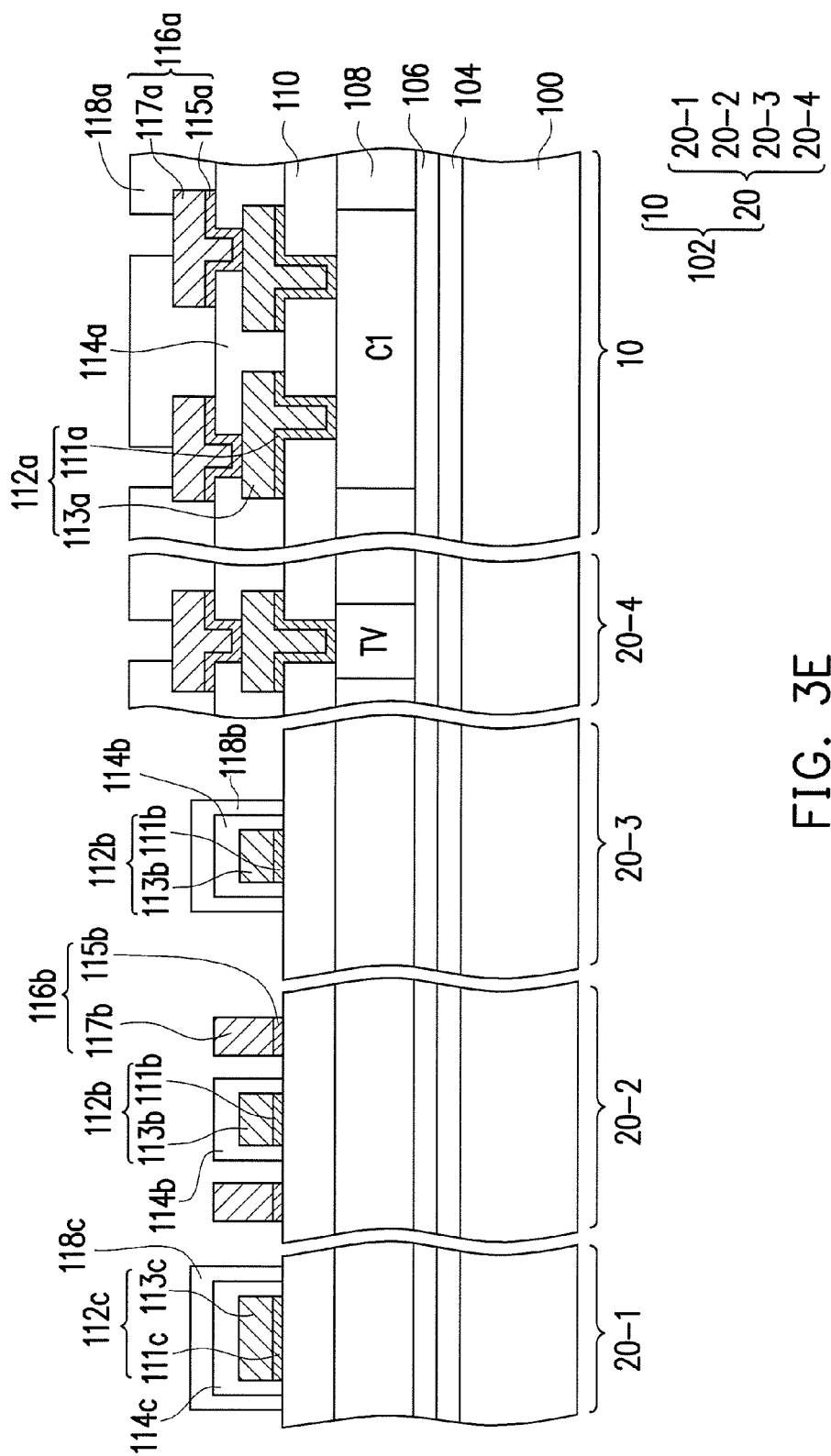

Referring to FIG. 2A and FIG. 3E, at step 212, a third dielectric layer 118a is formed over the second redistribution layer 116a in the chip area 10 of the package region 102, and another second pattern 118b/118c is simultaneously formed in the periphery area 20 of the package region 102, wherein the another second pattern 118b/118c covers the first pattern 112b/112c and the another second pattern 114b/114c and the first pattern 112b/112c have substantially the same outer profile. The another second pattern 118b/118c is marked as "PM3" in some drawings, because it is a third polymer layer in some embodiments.

In some embodiments, a third dielectric material layer (not shown) is formed across the chip area 10 and the periphery area 20. In some embodiments, the third dielectric material layer includes a polymer, such as PBO, polyimide, BCB, a combination thereof or the like, and is formed by a suitable fabrication technique such as spin-coating, lamination, deposition or the like. The third dielectric material layer is then patterned to form the third dielectric layer 118a and the another second pattern 118b/118c. In some embodiments, the third dielectric layer 118a has openings that expose a portion of the second redistribution layer 116a in the chip area 10 and the fourth periphery area 20-4. In some embodiments, in the first periphery area 20-1, the another second pattern 118c conformally and completely covers the sidewall and top of the first pattern 112c, without extending along the surface of the first dielectric layer 110. That is, the another second pattern 118c and the first pattern 112c have substantially the same outer profile. Similarly, in the third periphery area 20-3, the another second pattern 118b conformally and completely covers the sidewall and top of the first pattern 112b, without extending along the surface of the first dielectric layer 110. That is, the another second pattern 118b and the first pattern 112b have substantially the same outer profile.

In some embodiments, the another second pattern 118b/118c can be omitted from the step 212. Specifically, only the third dielectric layer 118a is formed over the second redistribution layer 116a in the chip area 10 of the package region 102 at step 212.

Figure 3F:
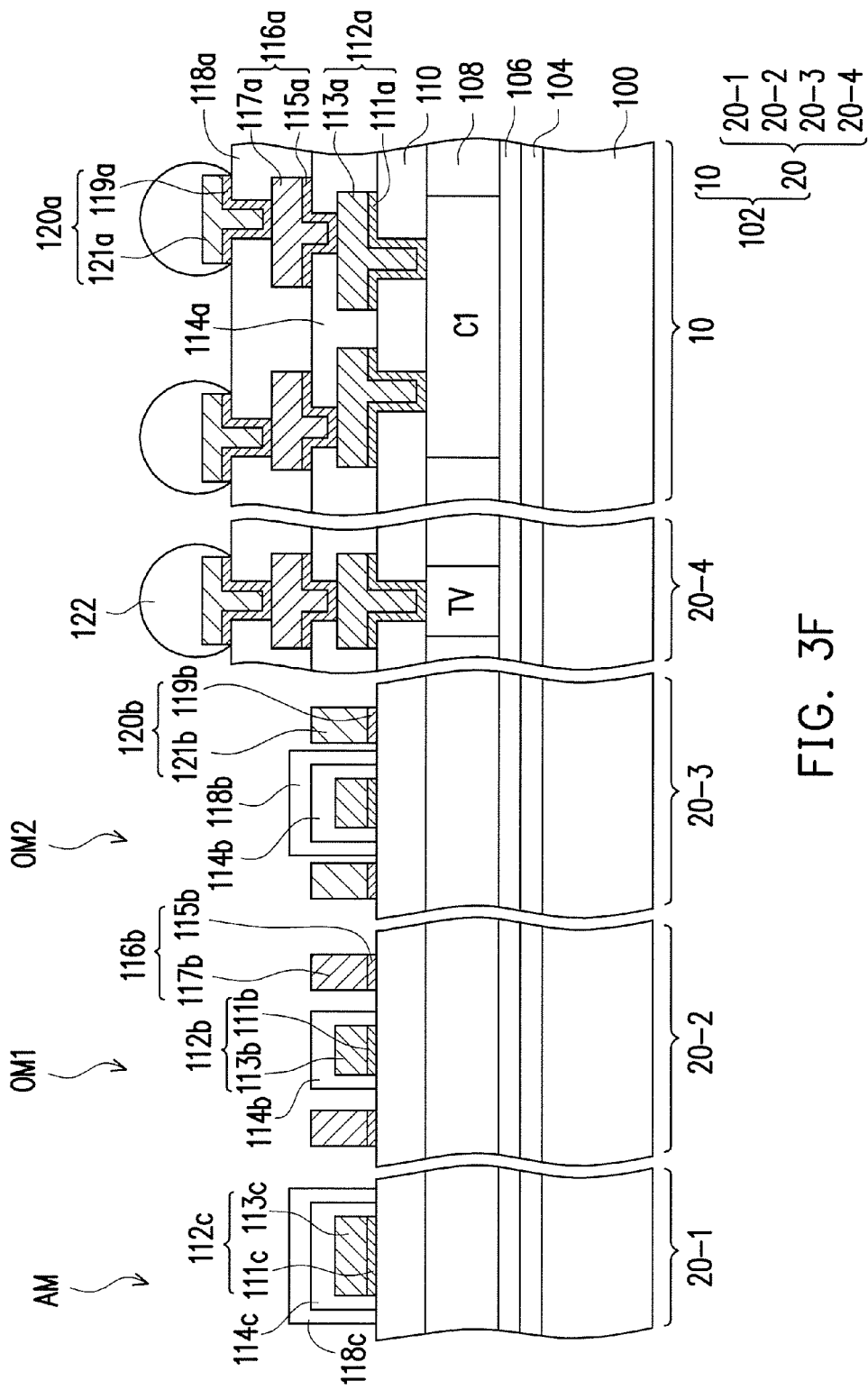

Referring to FIG. 2B and FIG. 3F, at step 214, a third redistribution layer 120a is formed in the chip area 10 of the package region 102 and another third pattern 120b is simultaneously formed in the periphery area 20 of the package region 10, wherein the third distribution layer 120a is through the third dielectric layer 118a and electrically connected to the second redistribution layer 116a, and the another third pattern 120b surrounds the another second pattern 118b. The another third pattern 120b is marked as "RDL3" in some drawings, because it is formed from the process of defining the third redistribution layer 120a in some embodiments.

In some embodiments, the method of forming the third redistribution layer 120a and the another third pattern 120b (step 214) is similar to the method of forming the second redistribution layer 116a and the third pattern 116b (step 210), so the details are not iterated herein. In some embodiments, the third redistribution layer 120a is formed in the chip area 10 and the fourth periphery area 20-4, and the another third pattern 120b is formed in the third periphery area 20-3. In some embodiments, the third redistribution layer 120a includes a seed layer 119a and a metal layer 121a, and the another third pattern 120b includes a seed layer 119b and a metal layer 121b. In some embodiments, the third redistribution layer 120a is also called an under-ball metallurgy (UBM) layer. In some embodiments, the another third pattern 120b surrounds the sidewall of the another second pattern 118b and is separated from the another second pattern 118b by a distance.

Referring to FIG. 2B and FIG. 3F, at step 216, balls 122 are formed in the chip area 10 of the package region 102 and electrically connected to the third redistribution layer 120a.

In some embodiments, the balls 122 are placed on the third redistribution layer 120a or the UBM layer. In some embodiments, the bumps 122 are made of a conductive material with low resistivity, such as Sn, Pb, Ag, Cu, Ni, Bi or an alloy thereof, and are formed by a suitable process such as evaporation, plating, ball drop, or screen printing.

Figure 3G:
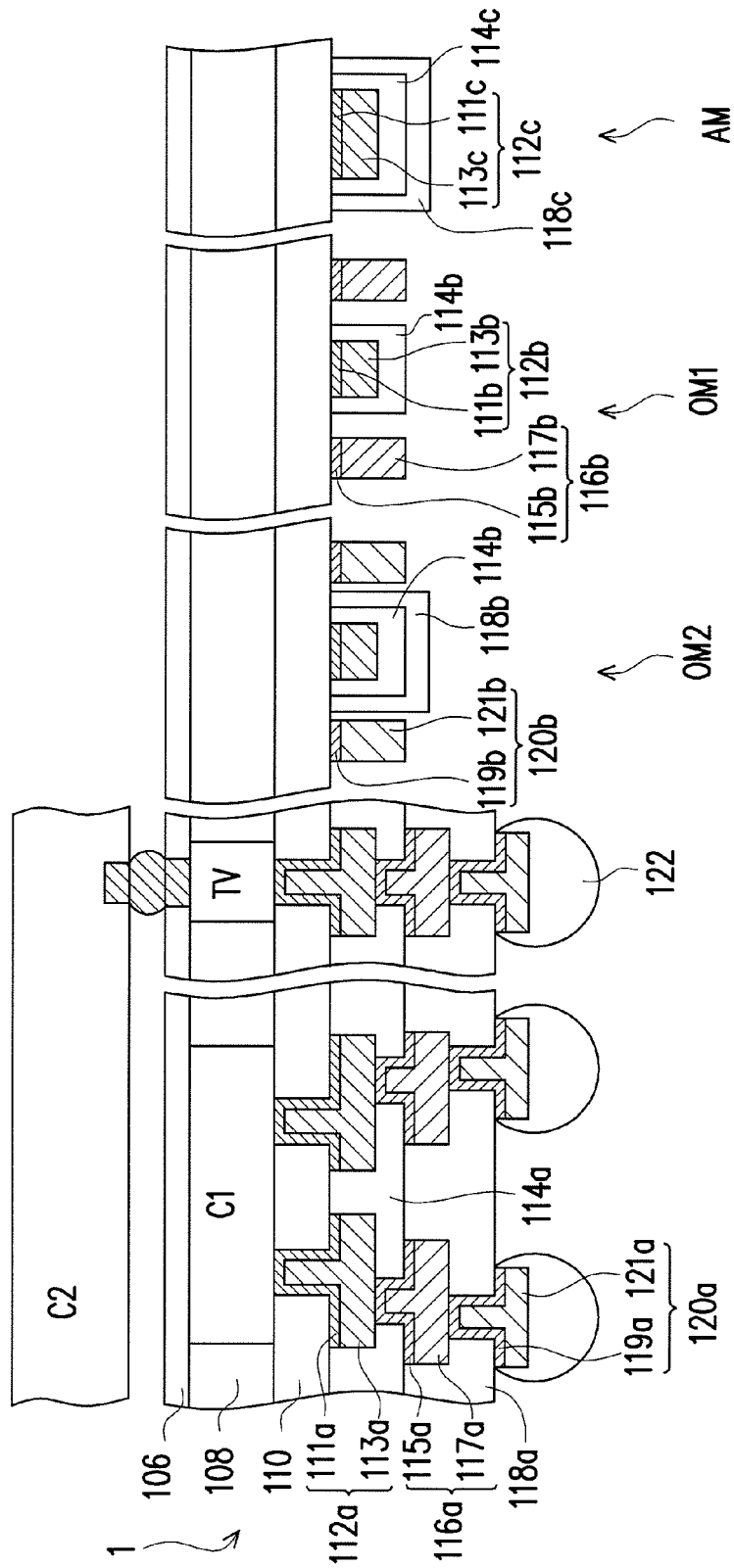

Referring to FIG. 2B and FIG. 3G, at step 218, the carrier 100 is removed and another chip C2 is electrically connected to the chip C1 to form package-on-package (PoP) device.

In some embodiments, the carrier 100 with the chip C1, the redistribution layers 112a/116a/120a and the balls 122 is turned over, the glue layer 104 is decomposed under heat of light, and the carrier 100 is then released from the integrated circuit package 1 formed thereon. In some embodiments, the dielectric layer 106 is patterned to form a plurality of openings therein. Another chip C2 or package is provided and then bonded to the through vias TV of the integrated circuit package 1 with balls inserted in the openings of the dielectric layer 106, so as to form a PoP device.

Referring to FIG. 2B and FIG. 3G, at step 220, a dicing process is performed to separate the package region 102 or the integrated circuit package 1 from an adjacent package region 102 or an adjacent integrated circuit package 1.

In some embodiments, a dicing or singulation process is performed along the scribe regions 101 to separate the package regions 102, and thus, multiple package structures each including a chip C1 are provided. A cutting machine used for the dicing process typically involves dicing with a rotating blade or a laser beam. In other words, the dicing or singulation process is, for example, a laser cutting process or a mechanical cutting process.

Figure 4:
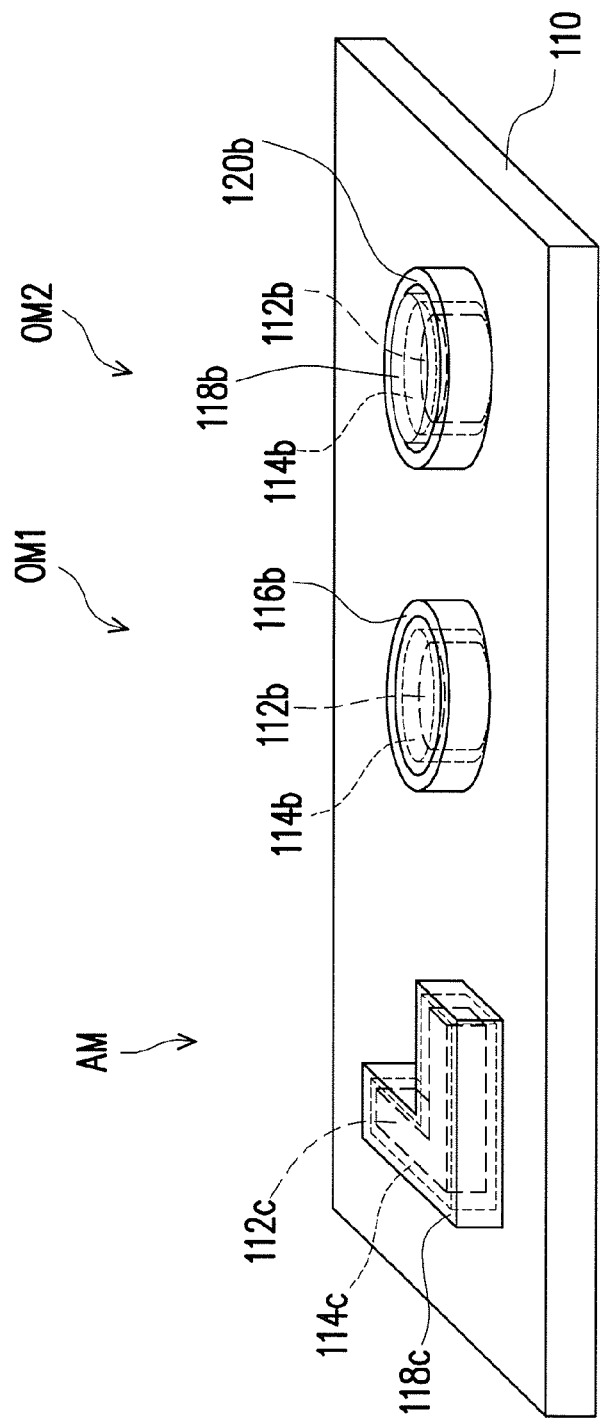
FIG. 4 illustrates perspective views of test key structures in accordance with some embodiments.

FIG. 4 illustrates perspective views of test key structures of FIG. 3F and FIG. 3G. In some embodiments, the test key structures of the disclosure includes an alignment mark AM and overlay marks OM1 and OM2. Each of the test key structures includes a first pattern 112b/112c over a polymer layer 108 or a first dielectric layer 110, and at least one second pattern 114b/118b/114c/118c covering the first pattern 112b/112c. Besides, the second pattern 114b/118b/114c/118c and the underlying first pattern 112b/112c have substantially the same outer profile or contour, one of the first pattern 112b/112c and the second pattern 114b/118b/114c/118c includes a dielectric material and the other of the first pattern 112b/112c and the second pattern 114b/118b/114c/118c includes a metal material.

In some embodiments, the alignment mark AM includes a first pattern 112c over a first dielectric layer 110, and two second patterns 114c and 118c covering the first pattern 112c. In some embodiments, the second pattern 114c is in physical contact with the first pattern 112c and another second pattern 118c. In some embodiments, the first pattern 112c is defined with a photomask for the lowest redistribution layer 112a.

In some embodiments, the overlay mark OM1 in the second periphery area 20-2 includes a first pattern 112b over a first dielectric layer 110, a second pattern 114b covering the first pattern 112b, and a third pattern 116b surrounding the second pattern 114b. In some embodiments, the second pattern 114b is in physical contact with the first pattern 112b while is not in physical contact with the third pattern 116b. In some embodiments, the first pattern 112b is defined with a photomask for the lowest redistribution layer 112a, and the third pattern 116b is defined with a photomask for an upper redistribution layer 116a.

In some embodiments, the overlay mark OM2 in the third periphery area 20-3 includes a first pattern 112b over a first dielectric layer 110, two second patterns 114b and 118b covering the first pattern 112b, and a third pattern 120b surrounding the second patterns 114b and 118b. In some embodiments, the second pattern 114b is in physical contact with the first pattern 112b and another second pattern 118b while is not in physical contact with the third pattern 120b. In some embodiments, the first pattern 112b is defined with a photomask for the lowest redistribution layer 112a, and the third pattern 120b is defined with a photomask for an upper redistribution layer 120a.

The overlay mark is for checking the alignment accuracy between layers. Specifically, the overlay mark OM1 is configured to measure the overlay data between the second redistribution layer 116a and the first redistribution layer 112a, and the overlay mark OM2 is configured to measure the overlay data between the third redistribution layer 120a and the first redistribution layer 112a.

It is noted that, in the test key structure of the disclosure, the second pattern 114b/118b/114c/118c conformally cover the first pattern 112b/112c, so the outer second pattern protects the inner first pattern from being damaged or deformed in the latter process stages. Besides, the alignment and overlay accuracy is significantly improved since the profile or contour of the test key structure is maintained as original.

In some embodiments, the first pattern 112b/112c includes a metal material, and the second pattern 114b/118b/114c/118e includes a dielectric material. However, the present disclosure is not limited thereto. In alternative embodiments, the first pattern can include a dielectric material, and the second pattern can include a metal material.

Figure 5A:
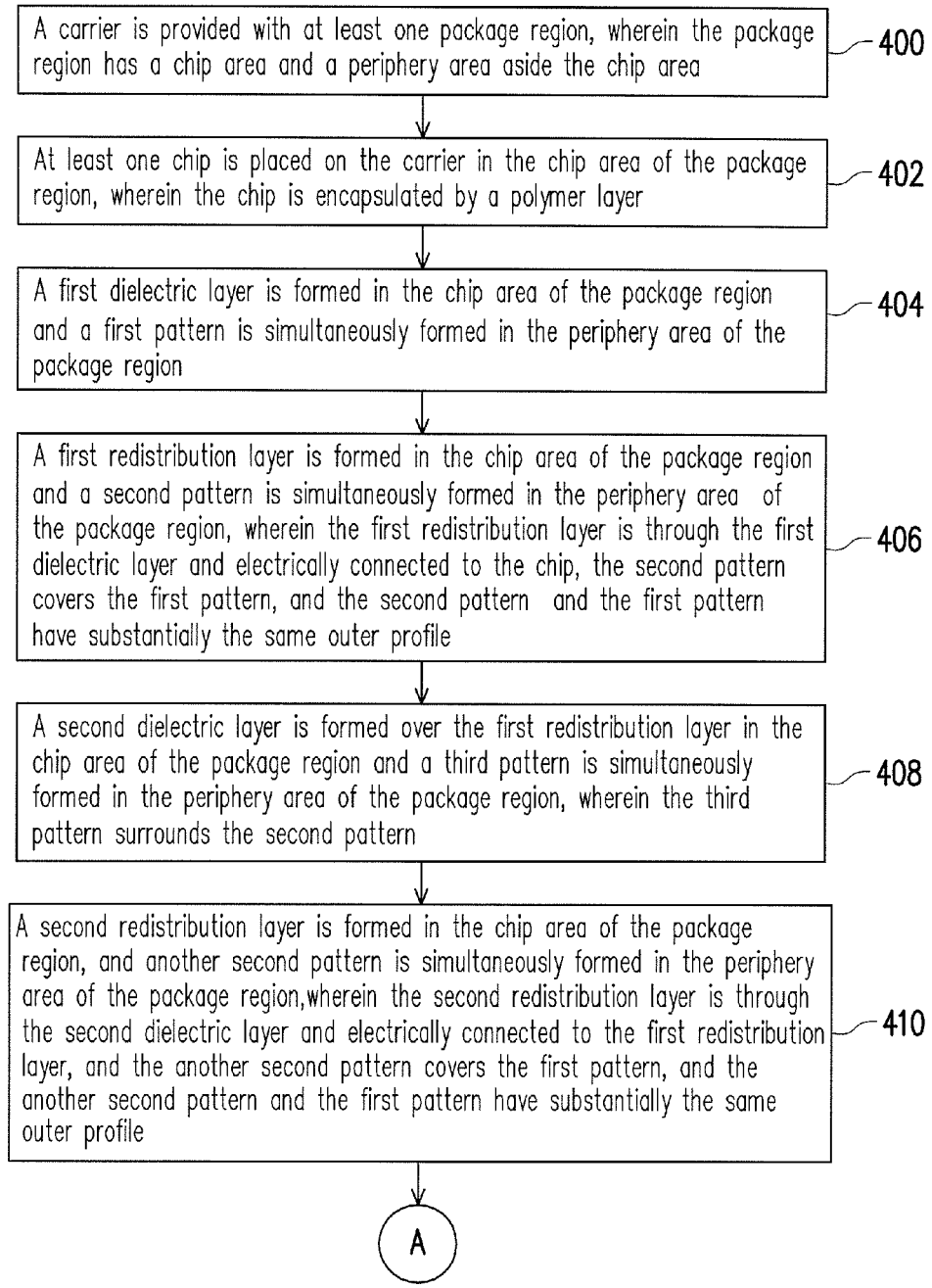
FIG. 5A to FIG. 5B illustrate a flow chart of a method of forming an integrated circuit package in accordance with alternative embodiments.
Figure 5B:
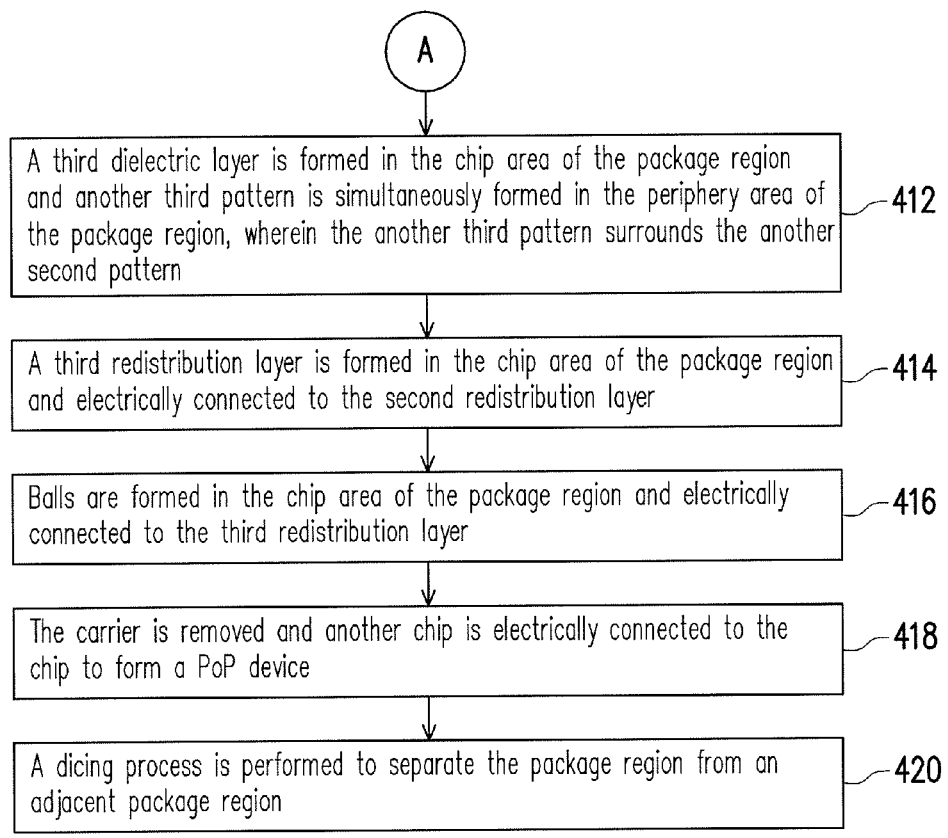
Figure 6A:
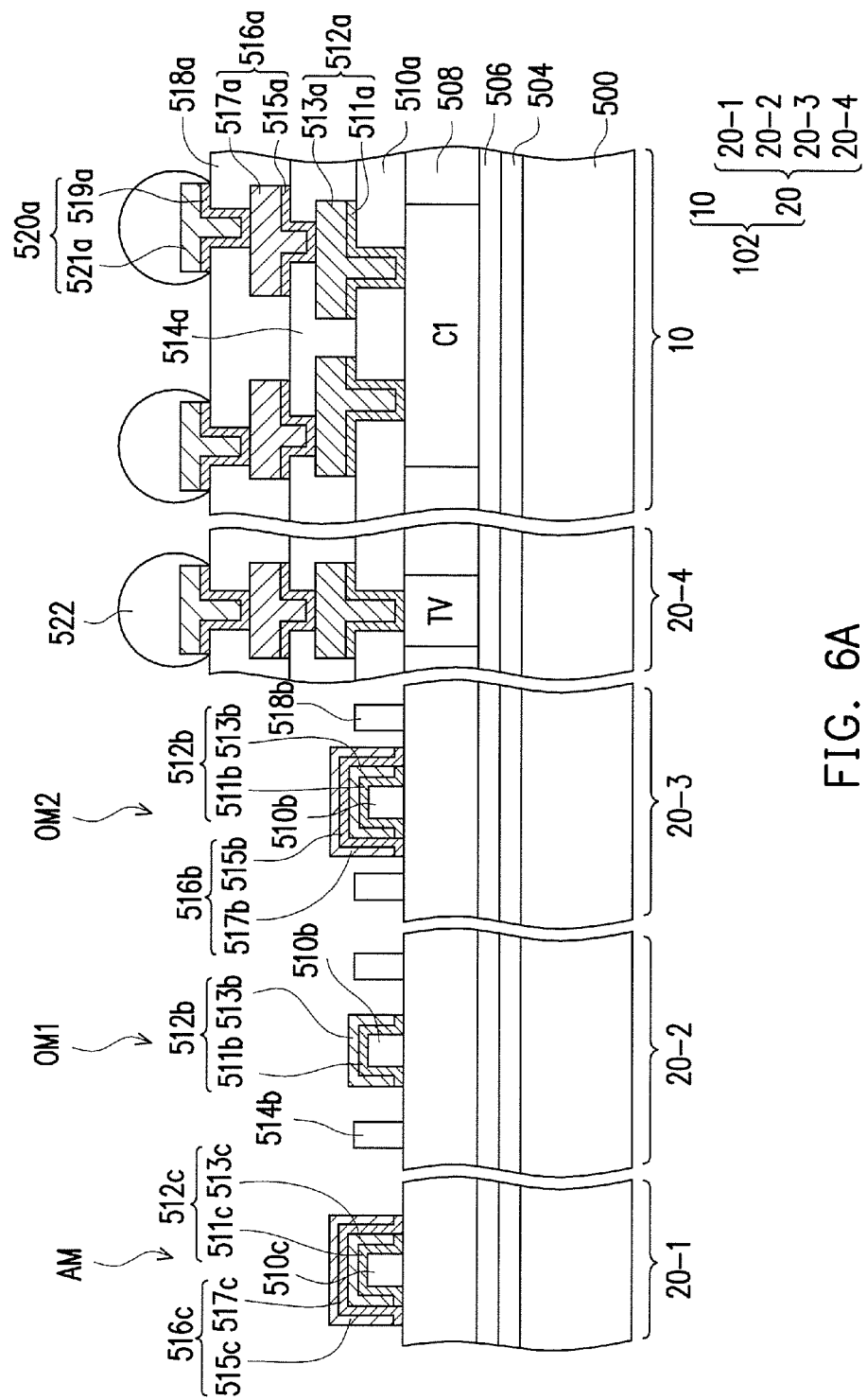
FIG. 6A to FIG. 6B illustrate cross-sectional views of a method of forming an integrated circuit package in accordance with alternative embodiments.
Figure 6B:
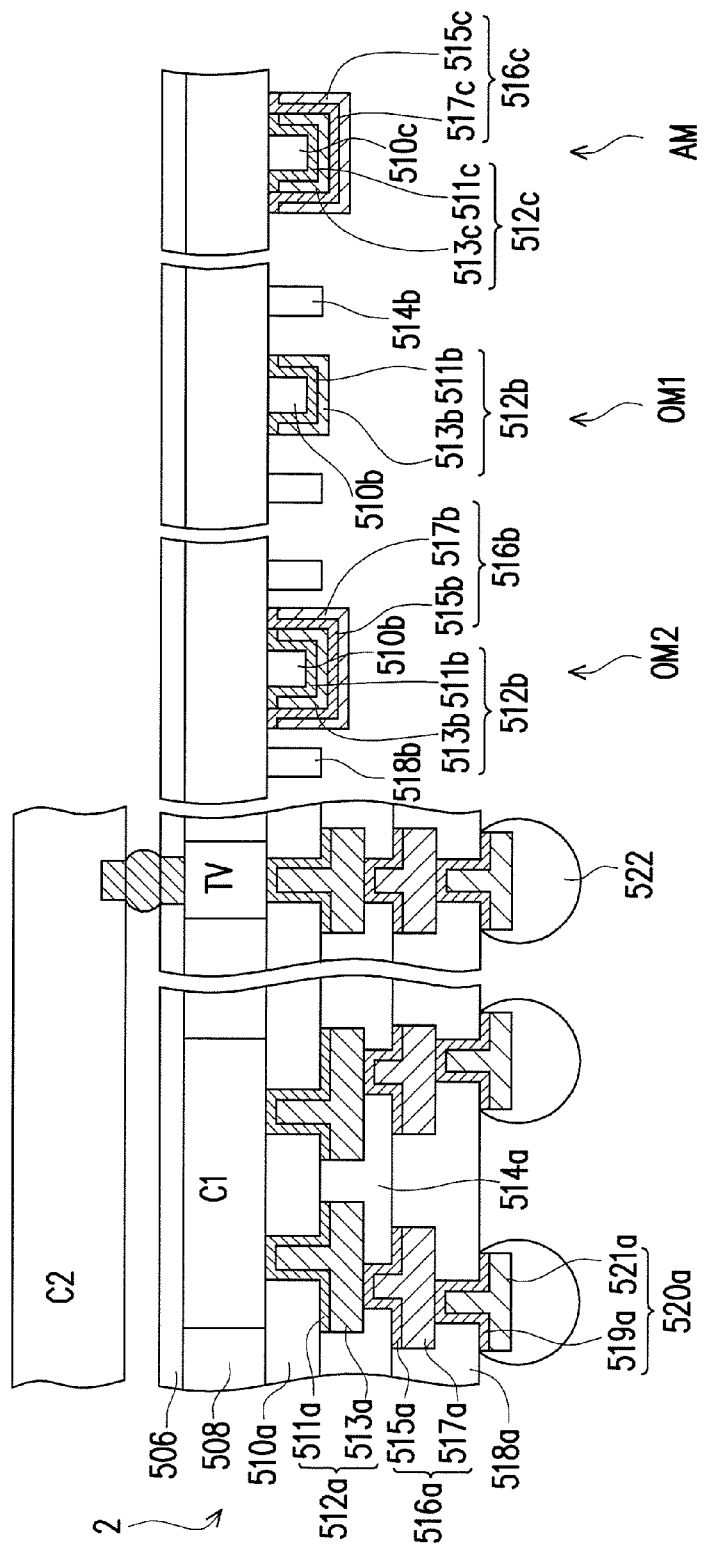

FIG. 5A to FIG. 5B illustrate a flow chart of a method of forming an integrated circuit package in accordance with alternative embodiments. FIG. 6A to FIG. 6B illustrate cross-sectional views of a method of forming an integrated circuit package in accordance with alternative embodiments.

Referring to FIG. 5A and FIG. 6A, at step 400, a carrier 500 is provided with at least one package region 102, wherein the package region 102 has a chip area 10 and a periphery area 20 aside the chip area 10. In some embodiments, the periphery area 20 includes first to fourth periphery areas 20-1 to 20-4.

At step 402, at least one chip C1 is placed on the carrier 500 in the chip area 10 of the package region 102, wherein the chip C1 is encapsulated by a polymer layer 508. In some embodiments, the carrier 500 is provided with a glue layer 504 and a dielectric layer 506 formed thereon, and the chip C1 is placed on the dielectric layer 506 of the carrier 500.

Figure 7:
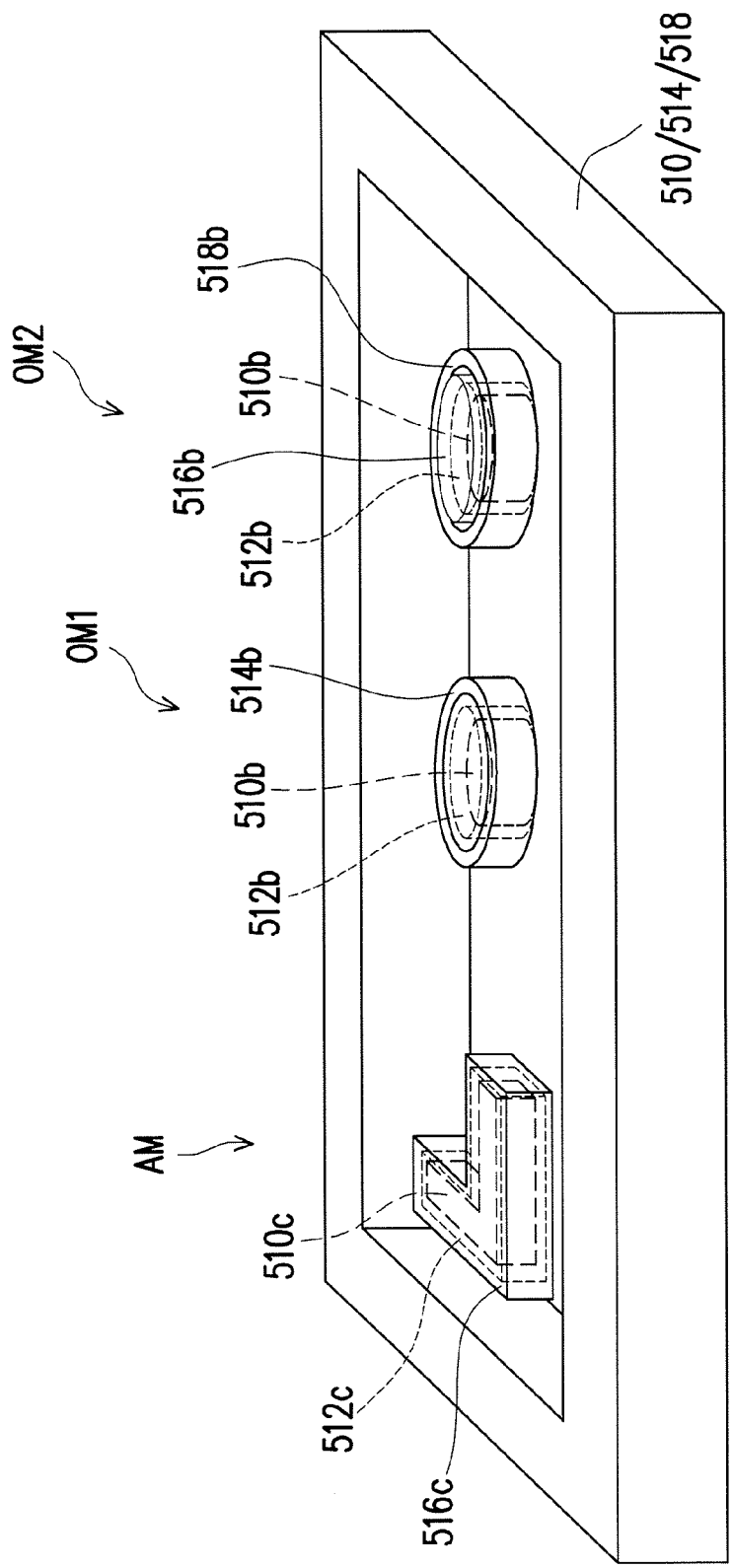
FIG. 7 illustrates perspective views of test key structures in accordance with alternative embodiments.

At step 404, a first dielectric layer 510a is formed in the chip area 10 of the package region 102 and a first pattern 510b/510c is simultaneously formed in the periphery area 20 (e.g., the first to third periphery areas 20-1 to 20-3) of the package region 102. In some embodiments, a first dielectric material layer is blanket-formed on the package region 102, and the first dielectric material layer is patterned to form the first dielectric layer 510a and the first pattern 510b/510c. In some embodiments, the remaining first dielectric material layer 510 forms a frame surrounding the first pattern 510b/510c, as shown in FIG. 7. The first pattern 510b/510c is marked as "PM1" in some drawings, because it is a first polymer layer in some embodiments.

At step 406, a first redistribution layer 512a is formed in the chip area 10 of the package region 102 and a second pattern 512b/512c is simultaneously formed in the periphery area 20 (e.g., the first to third periphery areas 20-1 to 20-3) of the package region 102, wherein the first redistribution layer 512a is through the first dielectric layer 510a and electrically connected to the chip C1, the second pattern 512b/512c covers the first pattern 510b/510c, and the second pattern 512b/512c and the first pattern 510b/510c have substantially the same outer profile. In some embodiments, the first redistribution layer 512a includes a seed layer 511a and a metal layer 513a, the second pattern 512b includes a seed layer 511b and a metal layer 513b, and the second pattern 512c includes a seed layer 511c and a metal layer 513c. The second pattern 512b/512c is marked as "RDL1" in some drawings, because it is formed from the process of defining the first redistribution layer 512a in some embodiments.

At step 408, a second dielectric layer 514a is formed over the first redistribution layer 512a in the chip area 10 of the package region 102 and a third pattern 514b is simultaneously formed in the periphery area 20 (e.g., the second periphery area 20-2) of the package region 102, wherein the third pattern 514b surrounds the second pattern 512b. In some embodiments, a second dielectric material layer is blanket-formed on the package region 102, and the second dielectric material layer is patterned to form the second dielectric layer 514a and the third pattern 514b. In some embodiments, the remaining second dielectric material layer 514 forms a frame surrounding the first pattern 510b/510c, as shown in FIG. 7. The third pattern 514b is marked as "PM2" in some drawings, because it is a second polymer layer in some embodiments.

At step 410, a second redistribution layer 516a is formed in the chip area 10 of the package region 102, and another second pattern 516b/516c is simultaneously formed in the periphery area 20 (e.g., the first and third periphery areas 20-1 and 20-3) of the package region 102, wherein the second redistribution layer 516a is through the second dielectric layer 514a and electrically connected to the first redistribution layer 512a, and the another second pattern 516b/516c covers the first pattern 510b/510c and the another second pattern 516b/516c and the first pattern 510b/510c have substantially the same outer profile. The another second pattern 516b/516c is marked as "RDL2" in some drawings, because it is formed from the process of defining the second redistribution layer 516a in some embodiments.

In some embodiments, the second pattern 516b/516c can be omitted from the step 410. Specifically, only the second redistribution layer 516a is formed in the chip area 10 of the package region 102 at step 410.

Referring to FIG. 5B and FIG. 6A, at step 412, a third dielectric layer 518a is formed in the chip area 10 of the package region 102 and another third pattern 518b is simultaneously formed in the periphery area 20 (e.g., the third periphery area 20-3) of the package region 102, wherein the another third pattern 518b surrounds the another second pattern 516b. In some embodiments, a third dielectric material layer is blanket-formed on the package region 102, and the third dielectric material layer is patterned to foil the third dielectric layer 518a and the another third pattern 518b. In some embodiments, the remaining third dielectric material layer 518 forms a frame surrounding the first pattern 510b/510c, as shown in FIG. 7. The another third pattern 518b is marked as "PM3" in some drawings, because it is a third polymer layer in some embodiments.

At step 414, a third redistribution layer 520a is formed in the chip area 10 of the package region 102 and electrically connected to the second redistribution layer 516a.

At step 416, balls 522 are formed in the chip area 10 of the package region 102 and electrically connected to the third redistribution layer 520a.

Referring to FIG. 5B and FIG. 6B, at step 418, the carrier 500 is removed and another chip C2 is electrically connected to the chip C1 to form a PoP device. In some embodiments, the carrier 500 with the chip C1, the redistribution layers 512a/516a/520a and the balls 522 is turned over, the glue layer 504 is decomposed under heat of light, and the carrier 500 is then released from the integrated circuit package 2 formed thereon. In some embodiments, the dielectric layer 506 is patterned to form a plurality of openings therein. Another chip C2 or package is provided and then bonded to the through vias TV of the integrated circuit package 2 with balls inserted in the openings of the dielectric layer 506, so as to form a PoP device.

At step 420, a dicing process is performed to separate the package region 102 or the integrated circuit package 2 from an adjacent package region 102 or an adjacent integrated circuit package 2.

FIG. 7 illustrate perspective views of test key structures of FIG. 6A and FIG. 6B. In some embodiments, the test key structures of the disclosure includes an alignment mark AM and overlay marks OM1 and OM2. Each of the test key structures includes a first pattern 510b/510c over a polymer layer 508, and at least one second pattern 512b/516b/512c/516c covering the first pattern 510b/510c. Besides, the second pattern 512b/516b/512c/516c and the underlying first pattern 510b/510c have substantially the same outer profile, one of the first pattern 510b/510c and the second pattern 512b/516b/512c/516c includes a dielectric material and the other of the first pattern 510b/510c and the second pattern 512b/516b/512c/516c includes a metal material.

In some embodiments, the alignment mark AM in the first periphery area 20-1 includes a first pattern 510c over a polymer layer 508, and two second patterns 512c and 516c covering the first pattern 510c. In some embodiments, the second pattern 512c is in physical contact with the first pattern 510c and another second pattern 516c. In some embodiments, the first pattern 510c is defined with a photomask for a first dielectric layer 510a adjacent to the lowest redistribution layer 512a.

In some embodiments, the overlay mark OM1 in the second periphery area 20-2 includes a first pattern 510b over a polymer layer 508, a second pattern 512b covering the first pattern 510b, and a third pattern 514b surrounding the second pattern 512b. In some embodiments, the second pattern 512b is in physical contact with the first pattern 510b while is not in physical contact with the third pattern 514b. In some embodiments, the first pattern 510b is defined with a photomask for a first dielectric layer 510a adjacent to the lowest redistribution layer 512a, and the third pattern 514b is defined with a photomask for an upper dielectric layer 514a.

In some embodiments, the overlay mark OM2 in the third periphery area 20-3 includes a first pattern 510b over a polymer layer 508, two second patterns 512b and 516b covering the first pattern 510b, and a third pattern 518b surrounding the second patterns 512b and 516b. In some embodiments, the second pattern 512b is in physical contact with the first pattern 510b and another second pattern 516b while is not in physical contact with the third pattern 518b. In some embodiments, the first pattern 510b is defined with a photomask for a first dielectric layer 510a adjacent to the lowest redistribution layer 512a, and the third pattern 518b is defined with a photomask for an upper dielectric layer 518a.

The overlay mark is for checking the alignment accuracy between layers. Specifically, the overlay mark OM1 is configured to measure the overlay data between the second dielectric layer 514a and the first dielectric layer 510a, and the overlay mark OM2 is configured to measure the overlay data between the third dielectric layer 518a and the first dielectric layer 510a.

Herein, one or two second patterns are provided, but the disclosure is not limited thereto. In alternative embodiments, three or more second patterns can be provided to cover the first pattern, as long as these second patterns have substantially the same outer profile as that of the first pattern.

It is noted that, in the test key structure of the disclosure, the second pattern 512b/516b/512c/516c conformally cover the first pattern 510b/510c, so the outer second pattern protects the inner first pattern from being damaged or deformed in the latter process stages. Besides, the alignment and overlay accuracy is significantly improved since the profile or contour of the test key structure is maintained as original. In some embodiments, the first pattern 510b/510c includes a dielectric material, and the second pattern 512*b*/516*b*/512*c*/516*c* includes a metal material.

Figure 8:
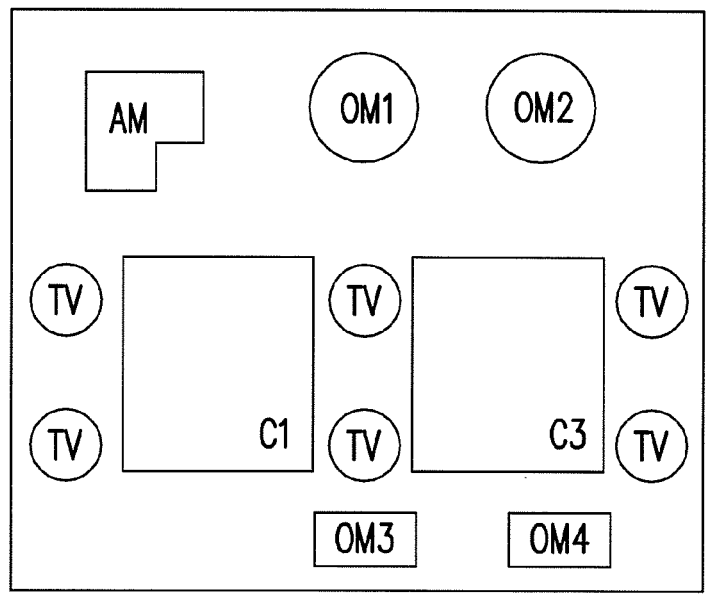
FIG. 8 and FIG. 9 illustrate simplified top views of package regions in accordance with alternative embodiments.
Figure 9:
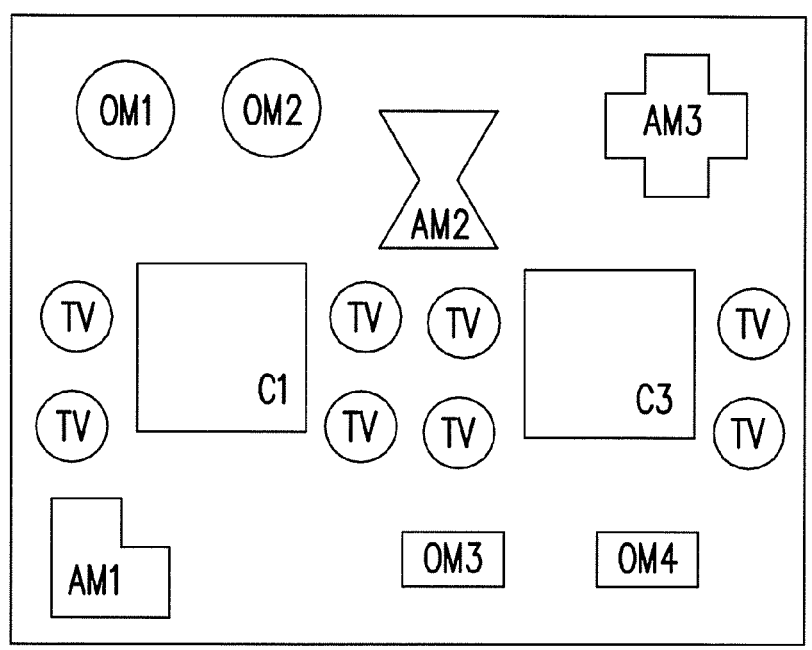

The mentioned embodiments in which only one chip C1 is placed in each package region or integrated circuit package are provide for illustration purposes, and are not construed as limiting the present disclosure. In alternative embodiments, as shown in FIG. 8 and FIG. 9, at least two chips C1 and C3 can be included in each integrated circuit package. The two chips C1 and C3 are of different functions or same function. In alternative embodiments, three or more chips can be placed in each integrated circuit package so as to provide a multi-functional IC package. That is, the number of the chips is not limited by the disclosure.

Besides, multiple test key structures (e.g., AM, AM1 to AM3 and OM1 to OM4) with different shapes can be included in each integrated circuit package. The shapes of the test key structures are not limited by the present disclosure. Specifically, the test key structures can be designed to have shapes such as box-in-box patterns, triangles, rectangles, circles, T-shapes, L-shapes, pluses, crosses, hourglasses, octagons, or other suitable shapes. Besides, the number of the test key structures is not limited by the disclosure.

Figure 10:
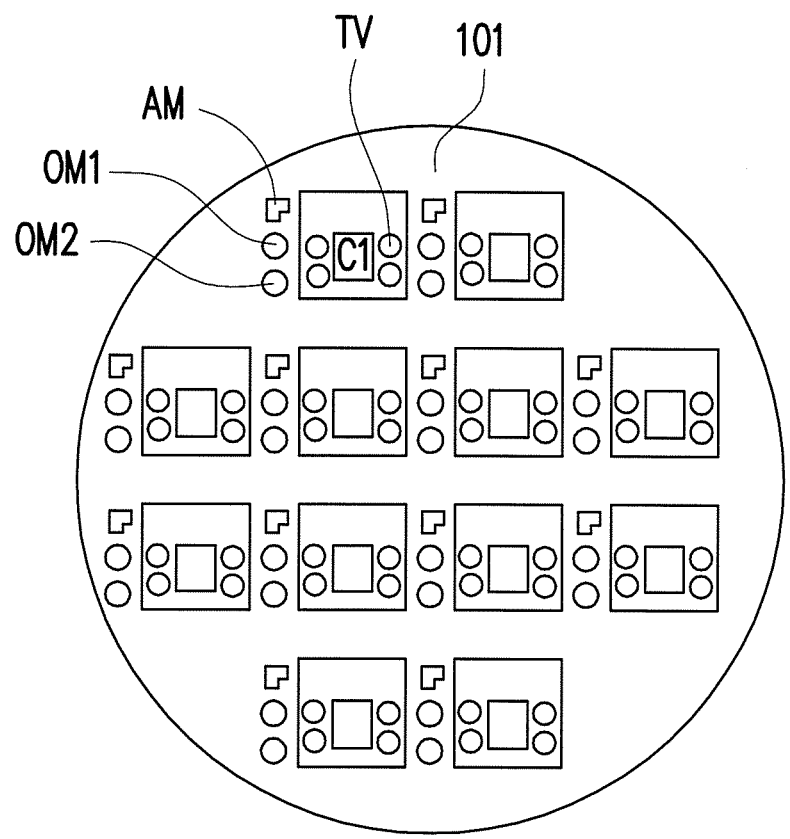
FIG. 10 illustrates a simplified top view of a carrier with multiple package regions in accordance with alternative embodiments.

In the mentioned embodiments, the test key structures are located in an integrated circuit package. However, the present disclosure is not limited thereto. The test key structures can be placed in the scribe lines 101, as shown in FIG. 10.

The mentioned embodiments in which the first to third patterns of the test key structure are formed after the at least one chip is placed in the package region are provide for illustration purposes, and are not construed as limiting the present disclosure. In alternative embodiments, at least one of the first and second patterns of the test key structure can be formed prior to the step of placing the chip in the package region.

The above embodiments in which a process with three redistribution layers is provided for illustration purposes, and is not construed as limiting the present disclosure. That is, the number of the redistribution layers is not limited by the present disclosure. In the following, a process with four redistribution layers is implemented, and only alignment marks and overlay marks are shown for the purpose of simplicity and clarity.

FIG. 11 to FIG. 14 illustrate top perspective views and cross-sectional views of different alignment marks in accordance with some embodiments.

Figure 11:
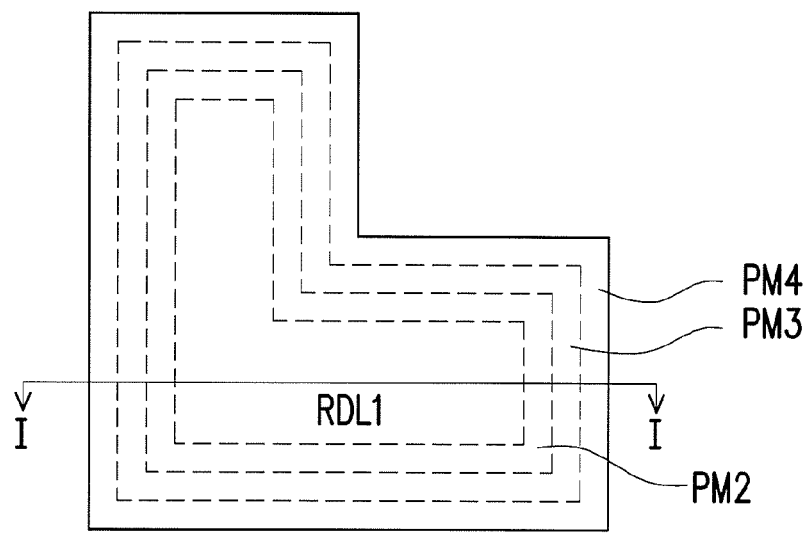
Figure 11:
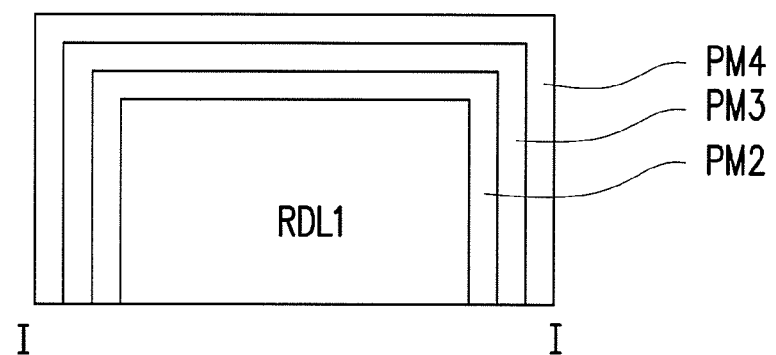

Referring to FIG. 11, the alignment mark includes one first pattern RDL1 and three second patterns PM2, PM3 and PM4 covering the first pattern RDL1. Each of the second patterns PM2, PM3 and PM4 and the first pattern RDL1 has substantially the same outer profile. In the embodiment of FIG. 11, the first pattern RDL1 includes a metal material, and the second patterns PM2, PM3 and PM4 include a dielectric material.

Figure 12:
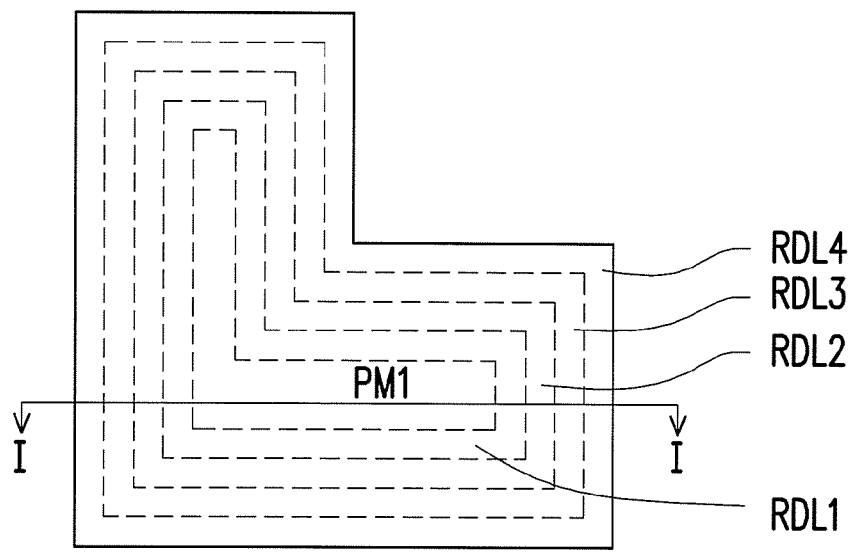
Figure 12:
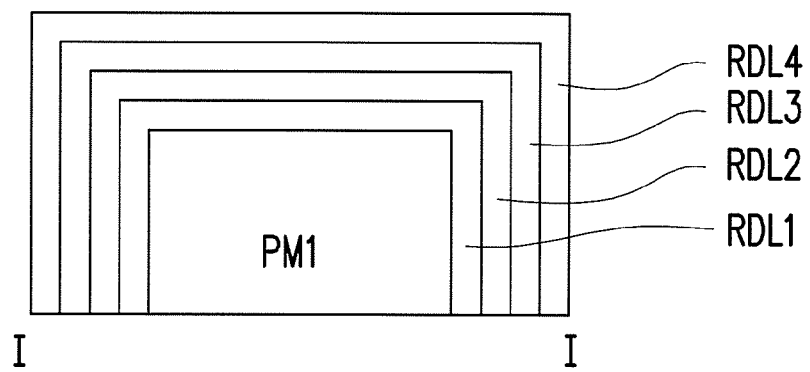

Referring to FIG. 12, the alignment mark includes one first pattern PM1 and four second patterns RDL1, RDL2, RDL3 and RDL4 covering the first pattern PM1. Each of the second patterns RDL1, RDL2, RDL3 and RDL4 and the first pattern PM1 has substantially the same outer profile. In the embodiment of FIG. 12, the first pattern PM1 includes a dielectric material, and the second patterns RDL1, RDL2, RDL3 and RDL4 include a metal material.

Figure 13:
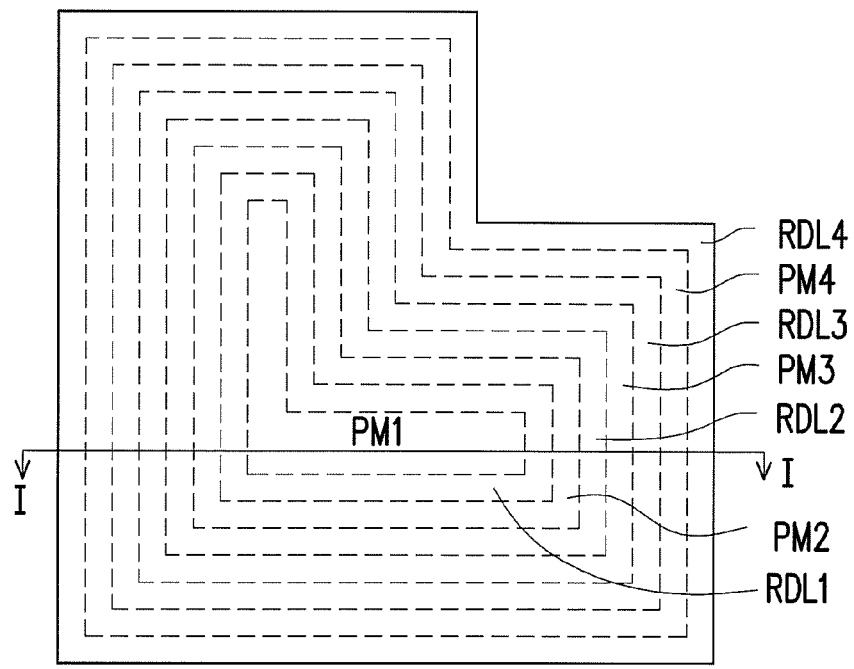
Figure 13:
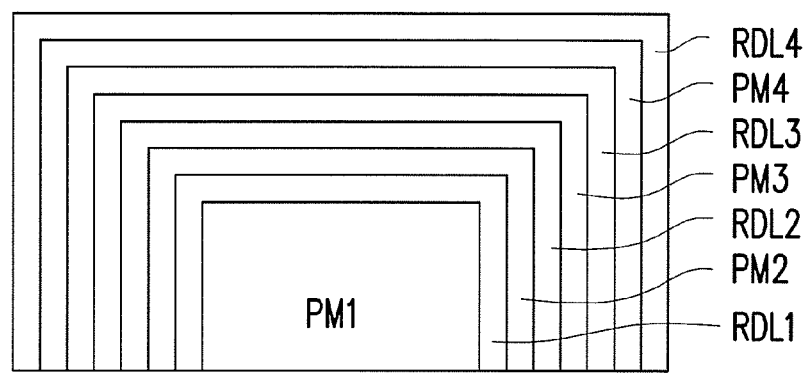

Referring to FIG. 13, the alignment mark includes one first pattern PM1 and seven second patterns RDL1, PM2, RDL2, PM3, RDL3, PM4, and RDL4 covering the first pattern PM1. Each of the second patterns RDL1, PM2, RDL2, PM3, RDL3, PM4, and RDL4 and the first pattern PM1 has substantially the same outer profile. In the embodiment of FIG. 13, the first pattern PM1 includes a dielectric material, the second patterns RDL1, RDL2, RDL3 and RDL4 include a metal material, and the second patterns PM2, PM3 and PM4 include a dielectric material.

Figure 14:
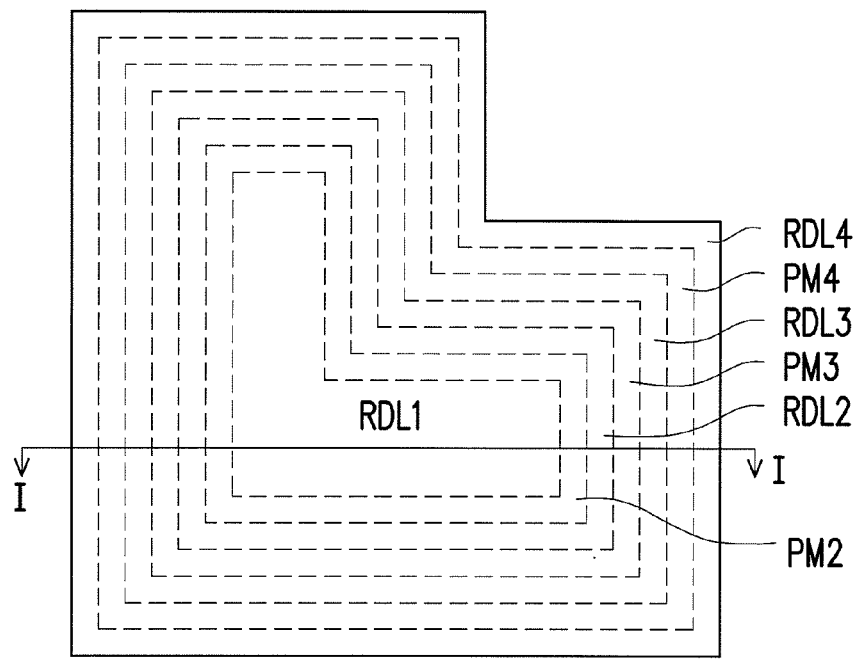
Figure 14:
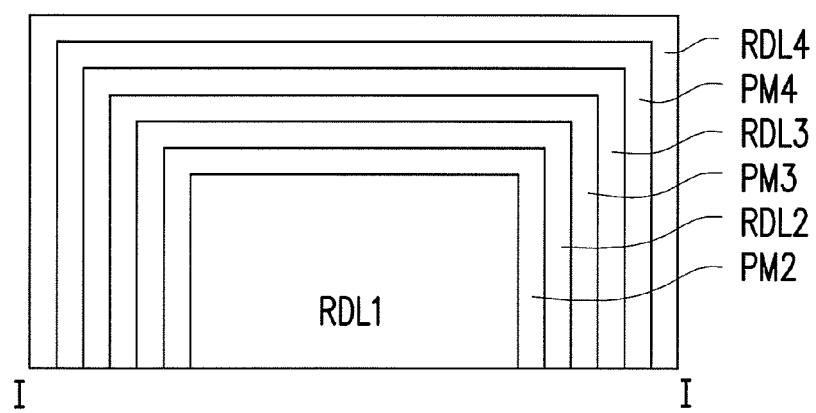

Referring to FIG. 14, the alignment mark includes one first pattern RDL1 and six second patterns PM2, RDL2, PM3, RDL3, PM4, and RDL4 covering the first pattern RDL1. Each of the second patterns PM2, RDL2, PM3, RDL3, PM4, and RDL4 and the first pattern RDL1 has substantially the same outer profile. In the embodiment of FIG. 14, the first pattern RDL1 includes a metal material, the second patterns RDL2, RDL3 and RDL4 include a metal material, and the second patterns PM2, PM3 and PM4 include a dielectric material.

FIG. 15 to FIG. 16 illustrate top perspective views at different process stages and final cross-sectional views of overlay marks in accordance with some embodiments.

Referring to FIG. 15, at PM1 process stage, a first pattern PM1 is formed in a first region OM-1. At RDL1 process stage, a first pattern RDL1 is formed in each of second to seventh regions OM-2 to OM-7. Besides, a second pattern RDL1 surrounding the corresponding first pattern PM1 is formed in the first region OM-1. At PM2 process stage, a second pattern PM2 covering the corresponding first pattern RDL1 is formed in each of the second to seventh regions OM-2 to OM-7. Besides, a third pattern PM2 surrounding the corresponding second pattern PM2 is formed in the second region OM-2. At RDL2 process stage, a third pattern RDL2 surrounding the corresponding second pattern PM2 is formed in the third region OM-3.

Referring to FIG. 16, at PM3 process stage, a third pattern PM3 surrounding the corresponding second pattern PM2 is formed in the fourth region OM-4. At RDL3 process stage, a third pattern RDL3 surrounding the corresponding second pattern PM2 is formed in the fifth region OM-5. At PM4 process stage, a third pattern PM4 surrounding the corresponding second pattern PM2 is formed in the sixth region OM-6. At RDL4 process stage, a third pattern RDL4 surrounding the corresponding second pattern PM2 is formed in the seventh region OM-7.

In view of the above, the test key structure of the disclosure includes at least one second pattern covering the first pattern, so the outer second pattern protects the inner first pattern from being damaged or deformed in the latter process stages. Besides, the second pattern and the underlying first pattern have substantially the same outer profile or contour. That is, the profile or contour of the test key structure is maintained as original. By such manner, better recognition for photolithography alignment and inline inspection can be achieved, so better overlay control and therefore improved yield can be obtained.

In accordance with some embodiments of the present disclosure, a test key structure includes a first pattern over a polymer layer, and at least one second pattern covering the first pattern. Besides, the second pattern and the first pattern have substantially the same outer profile, one of the first pattern and the second pattern includes a dielectric material and the other of the first pattern and the second pattern includes a metal material.

In accordance with alternative embodiments of the present disclosure, an integrated circuit package includes at least two chips and at least one test key structure aside the at least two chips. The test key structure includes a first pattern over a polymer layer, and at least one second pattern covering the first pattern. Besides, the second pattern and the first pattern have substantially the same outer profile, one of the first pattern and the second pattern includes a dielectric material and the other of the first pattern and the second pattern includes a metal material.

In accordance with yet alternative embodiments of the present disclosure, a method of forming an integrated circuit package is provided. A carrier is provided with at least one package region, wherein the package region has a chip area and a periphery area aside the chip area. At least one chip is placed on the carrier in the chip area of the package region, wherein the chip is encapsulated by a polymer layer. A first dielectric layer is formed in the chip area and the periphery area of the package region. A first redistribution layer is formed in the chip area of the package region and a first pattern is simultaneously formed in the periphery area of the package region, wherein the first redistribution layer is through the first dielectric layer and electrically connected to the chip. A second dielectric layer is formed over the first redistribution layer in the chip area of the package region and a second pattern is simultaneously formed in the periphery area of the package region, wherein the second pattern covers the first pattern, and the second pattern and the first pattern have substantially the same outer profile.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A test key structure, comprising:
a first pattern over a polymer layer; and
at least one second pattern covering the first pattern,
wherein an outer profile of the at least one second pattern is conformal with an outer profile of the first pattern, one of the first pattern and the at least one second pattern comprises a dielectric material and the other of the first pattern and the at least one second pattern comprises a metal material,
wherein the first pattern and the at least one second pattern are in contact with the polymer layer, a portion of a top surface of the polymer layer is not covered by the first pattern and the at least one second pattern, and is exposed.

2. The test key structure of claim 1, wherein the at least one second pattern comprises a plurality of second patterns having substantially the same outer profile.

3. The test key structure of claim 1, which comprises an alignment mark.

4. The test key structure of claim 1, which comprises an overlay mark.

5. The test key structure of claim 4, further comprising a third pattern surrounding the at least one second pattern.

6. The test key structure of claim 5, wherein the first pattern is defined with a photomask for a lowest redistribution layer, and the third pattern is defined with a photomask for an upper redistribution layer.

7. The test key structure of claim 5, wherein the first pattern is defined with a photomask for a dielectric layer adjacent to a lowest redistribution layer, and the third pattern is defined with a photomask for an upper dielectric layer.

8. The test key structure of claim 1, wherein the test key structure is located in an integrated circuit package.

9. The test key structure of claim 1, wherein the test key structure is located in a scribe line.

10. An integrated circuit package, comprising:
at least two chips;
at least one test key structure, aside the at least two chips and comprising:
a first pattern over a polymer layer; and
at least one second pattern covering the first pattern,
wherein the at least one second pattern and the first pattern have substantially the same outer profile, one of the first pattern and the at least one second pattern comprises a dielectric material and the other of the first pattern and the at least one second pattern comprises a metal material,
wherein the first pattern and the at least one second pattern are in contact with the polymer layer, a portion of a top surface of the polymer layer is not covered by the first pattern and the at least one second pattern, and is exposed.

11. The integrated circuit package of claim 10, wherein the at least one second pattern comprises a plurality of second patterns having substantially the same outer profile.

12. The integrated circuit package of claim 10, wherein the at least one test key structure comprises an alignment mark.

13. The integrated circuit package of claim 10, wherein the at least one test key structure comprises an overlay mark.

14. The integrated circuit package of claim 10, further comprising a plurality of through vias around the at least two chips.

15. The integrated circuit package of claim 10, wherein the at least two chips are of different functions.

16. A method of forming an integrated circuit package, comprising:
providing a carrier with at least one package region, wherein the package region has a chip area and a periphery area aside the chip area;
placing at least one chip on the carrier in the chip area of the package region, wherein the chip is encapsulated by a polymer layer;
forming a first dielectric layer in the chip area and the periphery area of the package region;
forming a first redistribution layer in the chip area of the package region and simultaneously forming a first pattern in the periphery area of the package region, wherein the first redistribution layer is through the first dielectric layer and electrically connected to the chip; and
forming a second dielectric layer over the first redistribution layer in the chip area of the package region and simultaneously forming a second pattern in the periphery area of the package region, wherein the second pattern covers the first pattern, and an outer profile of the at least one second pattern is conformal with an outer profile of the first pattern,
wherein the first pattern and the at least one second pattern are in contact with the polymer layer, a portion of a top surface of the polymer layer is not covered by the first pattern and the at least one second pattern, and is exposed.

17. The method of claim 16, wherein the first pattern and the second pattern constitute an alignment mark.

18. The method of claim 16, wherein the first pattern and the second pattern constitute an overlay mark.

19. The method of claim 18, further comprising:
forming a second redistribution layer in the chip area of the package region and simultaneously forming a third pattern in the periphery area of the package region, wherein the second distribution layer is through the second dielectric layer and electrically connected to the first redistribution layer, and the third pattern surrounds the second pattern.

* * * * *